United States Patent
Cao et al.

(10) Patent No.: US 12,349,540 B2
(45) Date of Patent: Jul. 1, 2025

(54) DISPLAY SUBSTRATE AND MANUFACTURING METHOD THEREOF, AND DISPLAY APPARATUS

(71) Applicants: MIANYANG BOE OPTOELECTRONICS TECHNOLOGY CO., Ltd., Sichuan (CN); BOE Technology Group Co., Ltd., Beijing (CN)

(72) Inventors: Xin Cao, Beijing (CN); Yawei Zhu, Beijing (CN); Heungsik Kim, Beijing (CN); Zifeng Wang, Beijing (CN); Haoyuan Fan, Beijing (CN)

(73) Assignees: MIANYANG BOE OPTOELECTRONICS TECHNOLOGY CO., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 581 days.

(21) Appl. No.: 17/428,621

(22) PCT Filed: Nov. 20, 2020

(86) PCT No.: PCT/CN2020/130597
§ 371 (c)(1),
(2) Date: Aug. 4, 2021

(87) PCT Pub. No.: WO2022/104739
PCT Pub. Date: May 27, 2022

(65) Prior Publication Data
US 2023/0139734 A1 May 4, 2023

(51) Int. Cl.
*H10K 59/121* (2023.01)
*H10D 30/01* (2025.01)
(Continued)

(52) U.S. Cl.
CPC ..... *H10K 59/1213* (2023.02); *H10D 30/0321* (2025.01); *H10D 30/6723* (2025.01);
(Continued)

(58) Field of Classification Search
CPC ............ H10K 59/126; H10K 59/1213; H10K 59/1216; H10K 59/1795; H10D 30/0321;
(Continued)

(56) References Cited

U.S. PATENT DOCUMENTS

| | | | |
|---|---|---|---|
| 10,622,428 B2* | 4/2020 | Oh | H10K 59/131 |
| 2003/0170937 A1* | 9/2003 | Eccleston | H10K 71/60 |
| | | | 257/E21.291 |

(Continued)

FOREIGN PATENT DOCUMENTS

| | | |
|---|---|---|
| CN | 103531641 A | 1/2014 |
| CN | 104300003 A | 1/2015 |

(Continued)

*Primary Examiner* — Eric K Ashbahian
(74) *Attorney, Agent, or Firm* — Ling Wu; Ling and Yang Intellectual Property; Stephen Yang

(57) ABSTRACT

The present disclosure provides a display substrate, a manufacturing method thereof and a display apparatus. The display substrate includes a base substrate, an active structure layer disposed on the base substrate and a source-drain structure layer disposed on the active structure layer. The active structure layer includes a first active layer and a second active layer. A material of the first active layer includes low-temperature polysilicon and a material of the second active layer includes oxide semiconductors. The source-drain structure layer includes a first source-drain electrode and a second source-drain electrode, wherein the first source-drain electrode overlaps with a first side surface of the first active layer through a first via hole and the second source-drain electrode overlaps with a second side surface of the second active layer through a second via hole.

10 Claims, 11 Drawing Sheets

(51) Int. Cl.
  *H10D 30/67* (2025.01)
  *H10K 59/179* (2023.01)
  *H10K 59/80* (2023.01)

(52) U.S. Cl.
  CPC ..... *H10D 30/6729* (2025.01); *H10D 30/6745* (2025.01); *H10D 30/6755* (2025.01); *H10K 59/1216* (2023.02); *H10K 59/1795* (2023.02); *H10K 59/8731* (2023.02); *H10K 59/8792* (2023.02)

(58) Field of Classification Search
  CPC ........... H10D 30/6745; H10D 30/6723; H10D 30/6755; H10D 30/6729
  See application file for complete search history.

(56) References Cited

U.S. PATENT DOCUMENTS

| | | | |
|---|---|---|---|
| 2012/0080681 A1 | 4/2012 | Kim et al. | |
| 2013/0119392 A1* | 5/2013 | Park | H10K 59/121 |
| | | | 438/34 |
| 2015/0001534 A1 | 1/2015 | Chang et al. | |
| 2015/0021572 A1 | 1/2015 | Amari | |
| 2015/0228798 A1* | 8/2015 | Lee | H01L 27/1248 |
| | | | 257/43 |
| 2018/0012948 A1 | 1/2018 | Lee | |
| 2018/0219032 A1 | 8/2018 | Lou et al. | |
| 2019/0006521 A1 | 1/2019 | Noh et al. | |
| 2019/0051713 A1 | 2/2019 | Bu et al. | |
| 2019/0204668 A1 | 7/2019 | Yang | |
| 2019/0267409 A1 | 8/2019 | Hu et al. | |
| 2020/0091263 A1 | 3/2020 | Wang et al. | |
| 2020/0105799 A1* | 4/2020 | Yuan | H01L 27/124 |
| 2020/0395426 A1* | 12/2020 | Han | H10K 59/126 |
| 2021/0225877 A1 | 7/2021 | Niu et al. | |

FOREIGN PATENT DOCUMENTS

| | | |
|---|---|---|
| CN | 105304722 A | 2/2016 |
| CN | 107452756 A | 12/2017 |
| CN | 107452757 A | 12/2017 |
| CN | 107591413 A | 1/2018 |
| CN | 108231795 A | 6/2018 |
| CN | 109216374 A | 1/2019 |
| CN | 109309122 A | 2/2019 |
| CN | 109728002 A | 5/2019 |
| CN | 110211974 A | 9/2019 |
| CN | 111725324 A | 9/2020 |
| TW | I602306 B | 10/2017 |

* cited by examiner

DISPLAY SUBSTRATE AND MANUFACTURING METHOD THEREOF, AND DISPLAY APPARATUS

CROSS-REFERENCE TO RELATED APPLICATION

The present disclosure is a U.S. National Phase Entry of International Application PCT/CN2020/130597 having an international filing date of Nov. 20, 2020, and the contents disclosed in the above-mentioned application are hereby incorporated as a part of this application.

TECHNICAL FIELD

The present disclosure relates to, but is not limited to, the field of display technology, in particular to a display substrate and a method for manufacturing the display substrate, and a display apparatus.

BACKGROUND

An Organic light-emitting Diode (abbreviated as OLED) is an active light-emitting display component, and has advantages of self-light-emission, wide viewing angle, high contrast, low power consumption, extremely high response speed, lightness and thinness, flexibility and low cost etc. With the continuous development of display technology, flexible display apparatuses which use OLEDs as light-emitting devices and control signals by thin film transistors (TFTs) have become mainstream products in the current display field.

SUMMARY

The following is a summary of subject matter described in detail herein. This summary is not intended to limit the protection scope of the claims.

The present disclosure provides a display substrate, which includes a base substrate, an active structure layer disposed on the base substrate and a source-drain structure layer disposed on the active structure layer, wherein the active structure layer includes a first active layer and a second active layer, a material of the first active layer includes low-temperature polysilicon and a material of the second active layer includes oxide semiconductors. The source-drain structure layer includes a first source-drain electrode and a second source-drain electrode, wherein the first source-drain electrode overlaps with a first side surface of the first active layer through a first via hole and the second source-drain electrode overlaps with a second side surface of the second active layer through a second via hole; the first side surface is a surface parallel to the base substrate, and the second side surface is a surface intersecting with the base substrate.

In an exemplary embodiment, the active structure layer includes: a first insulating layer disposed on the base substrate, the first active layer disposed on the first insulating layer, a second insulating layer covering the first active layer, a first gate electrode provided on the second insulating layer, a first gate electrode disposed on the second insulating layer, a third insulating layer covering the first gate electrode, a light shield layer disposed on the third insulating layer, a fourth insulating layer covering the light shield layer, the second active layer disposed on the fourth insulating layer, a fifth insulating layer covering the second active layer, a second gate electrode disposed on the fifth insulating layer, and a sixth insulating layer covering the second gate electrode; wherein the second insulating layer, the third insulating layer, the fourth insulating layer, the fifth insulating layer and the sixth insulating layer in the first via hole are removed to make the first source-drain electrode overlap with the first side surface of the first active layer through the first via hole; the second active layer, the fifth insulating layer and the sixth insulating layer in the second via hole are removed to make the second source-drain electrode overlap with the second side surface of the second active layer through the second via hole.

In an exemplary embodiment, the second via hole includes a communication hole provided on the fifth and sixth insulating layers and a contact hole provided on the second active layer, the communication hole communicates with the contact hole, and the second source-drain electrode overlaps with the second side surface of the second active layer through the contact hole.

In an exemplary embodiment, at an interface between the second active layer and the fifth insulating layer, an orthographic projection of the contact hole at the interface on the base substrate includes an orthographic projection of the communication hole at the interface on the base substrate.

In an exemplary embodiment, at an interface between the second active layer and the fifth insulating layer, a distance between boundaries of the contact hole at the interface is a first distance, and a distance between boundaries of the communication hole at the interface is a second distance, and the first distance is greater than the second distance.

In an exemplary embodiment, the first distance is 1.01 to 1.05 times the second distance.

In an exemplary embodiment, the second source-drain electrode also overlaps with a first side surface of the fifth insulating layer.

In an exemplary embodiment, an included angle between the second side surface of the second active layer and a plane of the base substrate is 50 degrees to 70 degrees.

The present disclosure further provides a display apparatus, including the display substrate described above.

The present disclosure further provides a method for manufacturing a display substrate, including:
  forming an active structure layer on a base substrate, wherein the active structure layer includes a first active layer and a second active layer, a material of the first active layer includes low-temperature polysilicon and a material of the second active layer includes oxide semiconductor;
  forming a source-drain structure layer on the active structure layer, wherein the source-drain structure layer includes a first source-drain electrode and a second source-drain electrode, the first source-drain electrode overlaps with a first side surface of the first active layer through a first via hole and the second source-drain electrode overlaps with a second side surface of the second active layer through a second via hole; the first side surface is a surface parallel to the base substrate, and the second side surface is a surface intersecting with the base substrate.

In an example embodiment, forming the active layer on the base substrate includes:
  sequentially forming the active structure layer including the first active layer and the second active layer on the base substrate;
  forming the first via hole and a communication hole through a patterning process, wherein the first via hole exposes the first side surface of the first active layer and the communication hole exposes a first side surface of the second active layer; and etching the second active layer in the communication hole through a cleaning process to form a contact hole exposing the second side surface of the second active layer.

In an example embodiment, forming the active layer on the base substrate includes:

sequentially forming the active structure layer including the first active layer and the second active layer on the base substrate;

forming a communication hole through a patterning process, wherein the communication hole exposes a first side surface of the second active layer;

forming the first via hole through another patterning process, wherein the first via hole exposes the first side surface of the first active layer; and etching the second active layer in the communication hole through a cleaning process to form a contact hole exposing the second side surface of the second active layer.

In an exemplary embodiment, at an interface between the second active layer and the fifth insulating layer, an orthographic projection of the contact hole at the interface on the base substrate includes an orthographic projection of the communication hole at the interface on the base substrate.

In an exemplary embodiment, at an interface between the second active layer and the fifth insulating layer, a distance between boundaries of the contact hole at the interface is a first distance, and a distance between boundaries of the communication hole at the interface is a second distance, and the first distance is greater than the second distance.

In an exemplary embodiment, the first distance is 1.01 to 1.05 times the second distance.

Other aspects will become apparent upon reading and understanding accompanying drawings and the detailed description.

BRIEF DESCRIPTION OF DRAWINGS

Accompanying drawings are used to provide a further understanding of technical solutions of the present disclosure and constitute a part of the specification to explain the technical solutions of the present disclosure together with embodiments of the present disclosure, and do not constitute any limitation on the technical solutions of the present disclosure. Shapes and sizes of various components in the drawings do not reflect true scales and are intended to illustrate schematically contents of the present disclosure only.

Figure 1:
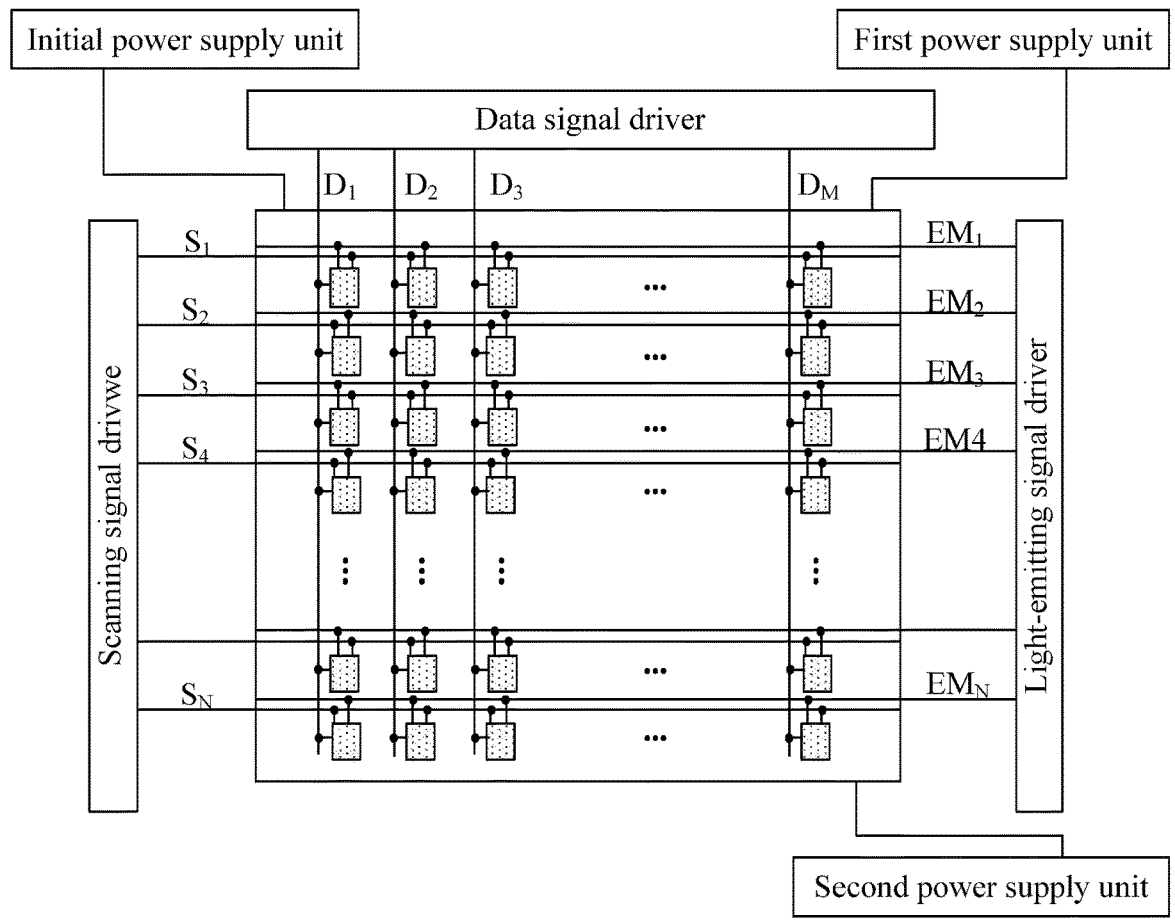
FIG. 1 is a schematic diagram of a structure of a display apparatus.

| Description of reference signs: | | |
| --- | --- | --- |
| 1-glass carrier plate; | 10-base substrate; | 11-first insulating layer; |
| 12-second insulating layer; | 13-third insulating layer; | 14-fourth insulating layer; |

-continued

Description of reference signs:

| | | |
|---|---|---|
| 15-fifth insulating layer; | 16-sixth insulating layer; | 17-first planarization layer; |
| 18-second planarization layer; | 21-first active layer; | 22-first gate electrode; |
| 23-first source electrode; | 24-first drain electrode; | 31-second active layer; |
| 32-second gate electrode; | 33-second source electrode; | 34-second drain electrode; |
| 41-first capacitor electrode; | 42-second capacitor electrode | 51- light shield layer; |
| 52-connection electrode; | 102-drive circuit layer; | 103-light-emitting device; |
| 104-encapsulation layer; | 301-anode; | 302-pixel define layer; |
| 303-organic light-emitting layer; | 304-cathode; | 401-first encapsulation layer; |
| 402-second encapsulation layer; | 403-third encapsulation layer. | |

DETAILED DESCRIPTION

To make objects, technical solutions and advantages of the present disclosure more clear, embodiments of the present disclosure will be described in detail below with reference to the drawings. It should be noted that the embodiments may be implemented in many different forms. Those of ordinary skills in the art may readily understand the fact that implementations and contents may be transformed into a variety of forms without departing from the essence and scope of the present disclosure. Therefore, the present disclosure should not be construed as being limited only to what is described in the following embodiments. The embodiments and features in the embodiments in the present disclosure may be combined randomly if there is no conflict.

In the drawings, sizes of various constituent elements and thicknesses and regions of layers are sometimes exaggerated for clarity. Therefore, an implementation of the present disclosure is not necessarily limited to the sizes shown. The shapes and sizes of various components in the drawings do not reflect true scales. In addition, the drawings schematically show ideal examples, and an implementation of the present disclosure is not limited to the shapes or values shown in the drawings.

The ordinal numbers "first", "second", "third" and the like in this specification are used to avoid confusion between constituent elements, but not to constitute limitations on quantities.

In this specification, for sake of convenience, wordings, such as "central", "upper", "lower", "front", "rear", "vertical", "horizontal", "top", "bottom", "inner", "outer" and the like which are used to indicate orientational or positional relations which are used to describe the positional relations between constituent elements with reference to the drawings, are only for a purpose of facilitating description of this specification and simplifying the description, rather than indicating or implying that the device or element referred to must have a specific orientation, or must be constructed and operated in a particular orientation, and therefore cannot be construed as limitations on the present disclosure. The positional relations between the constituent elements are appropriately changed according to the directions of the constituent element described. Therefore, the wordings are not limited in the specification, and may be replaced appropriately according to situations.

In this specification, terms "install", "connect" and "couple" shall be understood in a broad sense unless otherwise explicitly specified and defined. For example, a connection may be a fixed connection, or a detachable connection, or an integrated connection; it may be a mechanical connection, or an electrical connection; it may be a direct connection, or an indirect connection through middleware, or an internal connection between two elements. For those of ordinary skills in the art, the specific meanings of the above terms in the present disclosure may be understood according to specific situations.

In this specification, a transistor refers to an element including at least three terminals, namely a gate electrode, a drain electrode and a source electrode. The transistor has a channel region between the drain electrode (drain electrode terminal, drain region or drain electrode) and the source electrode (source electrode terminal, source region or source electrode), and current can flow through the drain electrode, the channel region and the source electrode. It should be noted that in this specification, the channel region refers to a region through which current mainly flows.

In this specification, the first electrode may be a drain electrode and the second electrode may be a source electrode, or the first electrode may be a source electrode and the second electrode may be a drain electrode. Functions of the "source electrode" and the "drain electrode" are sometimes interchangeable in a case where transistors with opposite polarities are used or in a case where the current direction changes during operation of the circuit. Therefore, in this specification, "source electrode" and "drain electrode" are interchangeable.

In this specification, an "electrical connection" includes a case where constituent elements are connected together through an element with a certain electric action. The "element with a certain electric action" is not particularly limited as long as it can transmit and receive electrical signals between the connected constituent elements. Examples of the "element with a certain electric action" include not only electrodes and wirings, but also switching elements such as transistors, resistors, inductors, capacitors, and other elements having various functions.

In this specification, "parallel" refers to a case where an angle formed by two straight lines is above −10° and below 10°, and thus also includes a case where the angle is above −5° and below 5°. In addition, "perpendicular" refers to a case where an angle formed by two straight lines is above −80° and below 100°, and thus also includes a case where the angle is above −85° and below 95°.

In this specification, "film" and "layer" are interchangeable. For example, sometimes "conductive layer" may be replaced by "conductive film". Similarly, "insulating film" may sometimes be replaced by "insulating layer".

"About" in the present disclose means that limits of a value are not limited strictly, and the value is within a range of process and measurement errors.

FIG. 1 is a schematic diagram of a structure of a display apparatus. As shown in FIG. 1, the OLED display apparatus may include a scanning signal driver, a data signal driver, a light-emitting signal driver, an OLED display substrate, a first power supply unit, a second power supply unit and an initial power supply unit. In an exemplary embodiment, the OLED display substrate at least includes multiple scanning signal lines ($S_1$ to $S_N$), multiple data signal lines ($D_1$ to $D_M$) and multiple light-emitting signal lines ($EM_1$ to $EM_N$). The scanning signal driver is configured to sequentially supply scanning signals to the multiple scanning signal lines ($S_1$ to $S_N$). The data signal driver is configured to supply data signals to the multiple data signal lines ($D_1$ to $D_M$). The light-emitting signal driver is configured to sequentially supply light-emitting control signals to the multiple light-emitting signal lines ($EM_1$ to $EM_N$). In an exemplary embodiment, the multiple scanning signal lines and the multiple light-emitting signal lines extend along a horizontal direction. The display apparatus includes multiple sub-pixels, wherein each sub-pixel includes a pixel drive circuit and a light-emitting device. The pixel drive circuit of one sub-pixel may be connected to one scanning signal line, one light-emitting control line and one data signal line. The first power supply unit, the second power supply unit and the initial power supply unit are respectively configured to supply a first power supply voltage, a second power supply voltage and an initial power supply voltage to a pixel drive circuit through a first power supply line, a second power supply line and an initial signal line.

Figure 2:
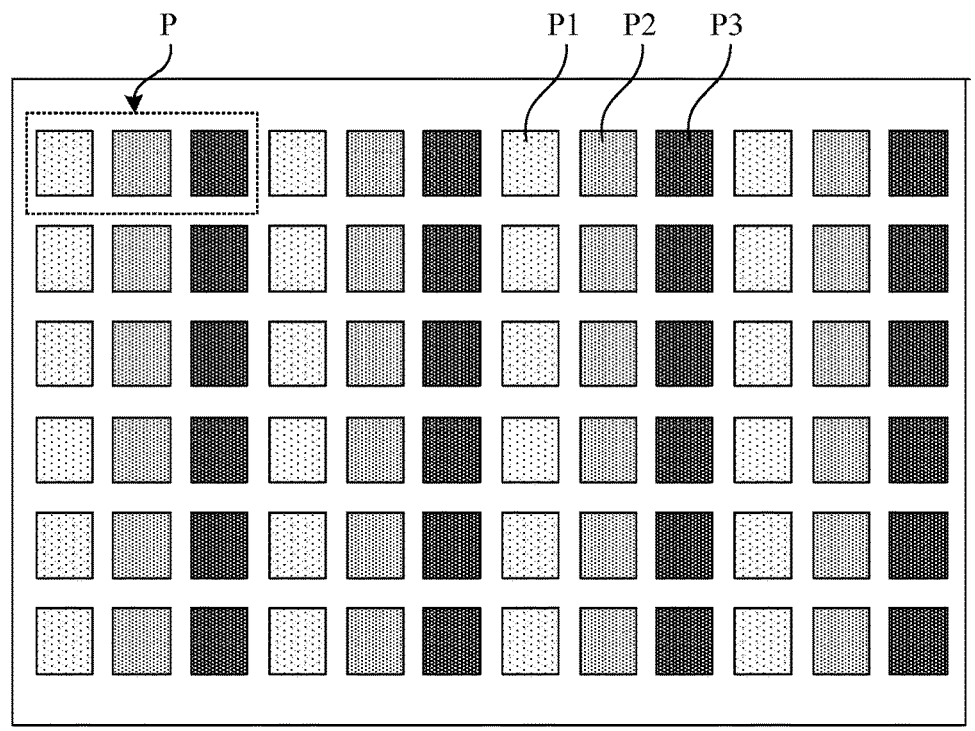
FIG. 2 is a schematic plan view of a structure of a display substrate.

FIG. 2 is a schematic plan view of a structure of a display substrate. As shown in FIG. 2, the display substrate may include multiple pixel units P arranged in a matrix. At least one of the multiple pixel units P includes first light-emitting units P1 that emit light of a first color, second light-emitting units P2 that emit light of a second color and third light-emitting units P3 that emit light of a third color. The first light-emitting units P1, the second light-emitting units P2 and the third light-emitting units P3 each include a pixel circuit and a light-emitting device. Pixel circuits in the first light-emitting units P1, the second light-emitting units P2 and the third light-emitting units P3 are respectively connected to the scanning signal lines, the data signal lines, and the light-emitting signal lines respectively. The pixel drive circuits are configured to receive the data voltage transmitted by the data signal lines under the control of the scanning signal lines and the light-emitting signal lines, and output a corresponding current to the light-emitting devices. The light-emitting devices in the first light-emitting unit P1, the second light-emitting unit P2 and the third light-emitting unit P3 are respectively connected to the pixel drive circuits of the corresponding light-emitting units where the light-emitting devices are located. The light-emitting devices are configured to emit light with a corresponding brightness, in response to currents output by the pixel circuits of the corresponding light-emitting units where the light-emitting devices are located.

In an exemplary embodiment, the pixel units P may include red light-emitting units, green light-emitting units and blue light-emitting units; or may include red light-emitting units, green light-emitting units, blue light-emitting units and white light-emitting units, which are not limited herein in the present disclosure. In an exemplary embodiment, a shape of a light-emitting unit in a pixel unit may be a rectangle, a diamond, a pentagon or a hexagon, etc. When the pixel unit includes three light-emitting units, the three light-emitting units may be arranged side by side horizontally, side by side vertically, or in a pyramid manner with two units at the bottom and one unit on the top. When the pixel unit includes four light-emitting units, the four light emitting units may be arranged side by side horizontally, side by side vertically, or in a square manner, which are not limited herein in the present disclosure.

Figure 3:
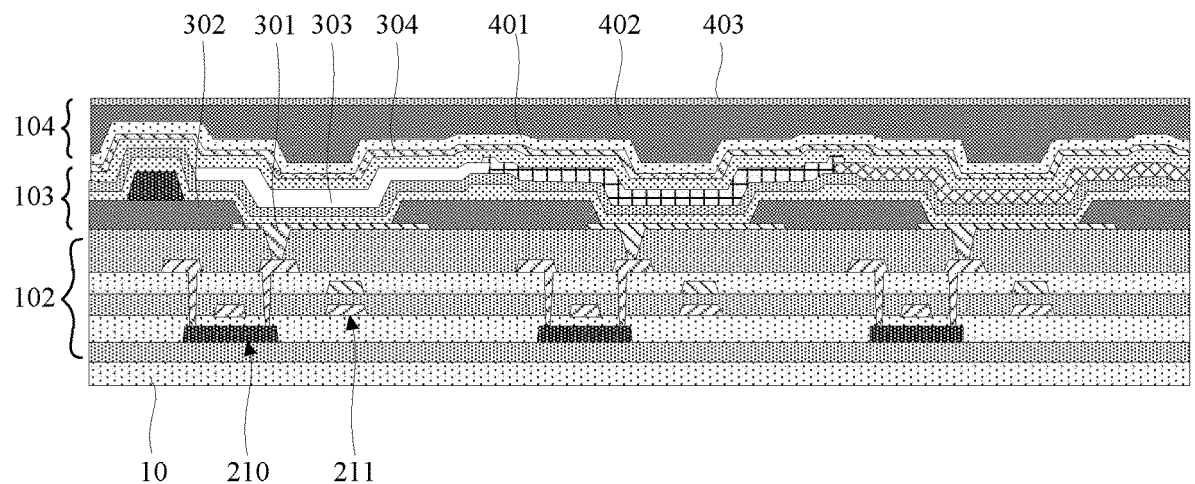
FIG. 3 is a schematic sectional view of a display substrate.

FIG. 3 is a schematic sectional view of a structure of a display substrate, showing a structure of three sub-pixels in an OLED display substrate. As shown in FIG. 3, on a plane perpendicular to the display substrate, the display substrate may include a drive circuit layer 102 disposed on a base substrate 10, a light-emitting device 103 disposed on a side of the drive circuit layer 102 away from the base substrate 10, and an encapsulation layer 104 disposed on a side of the light-emitting device 103 away from the base substrate 10. In some possible implementations, the display substrate may include other film layers, such as spacer posts, etc., which are not limited herein in the present disclosure.

In an exemplary implementation, the base substrate may be a flexible base substrate or may be a rigid base substrate. The flexible base substrate may include a first flexible material layer, a first inorganic material layer, a semiconductor layer, a second flexible material layer and a second inorganic material layer which are stacked. Materials of the first flexible material layer and the second flexible material layer may be polyimide (PI), polyethylene terephthalate (PET) or a polymer soft film with surface treatment, materials of the first inorganic material layer and the second inorganic material layer may be silicon nitride (SiNx) or silicon oxide (SiOx), etc., for improving the moisture and oxygen resistance capability of the base substrate, and the material of the semiconductor layer may be amorphous silicon (a-si).

In an exemplary embodiment, a drive circuit layer 102 of each sub-pixel may include multiple transistors and storage capacitors forming a pixel drive circuit, an example of which is illustrated in FIG. 3 where each sub-pixel includes one transistor and one storage capacitor. In some possible implementations, the drive circuit layer 102 of each sub-pixel may include: a first insulating layer disposed on the base substrate, an active layer disposed on the first insulating layer, a second insulating layer covering the active layer, a gate electrode and a first capacitor electrode disposed on the second insulating layer, a third insulating layer covering the gate electrode and the first capacitor electrode, a second capacitor electrode disposed on the third insulating layer, and a fourth insulating layer covering the second capacitor electrode. The second insulating layer, the third insulating layer and the fourth insulating layer are provided thereon with via holes exposing the active layer. The drive circuit layer includes a source electrode and a drain electrode disposed on the fourth insulating layer, wherein the source electrode and the drain electrode are respectively connected to the active layer through the via holes, and further includes a planarization layer covering the aforementioned structures, wherein the planarization layer is provided with a via hole exposing the drain electrode. The active layer, the gate electrode, the source electrode and the drain electrode form a driving transistor 210. The first capacitor electrode and the second capacitor electrode form a storage capacitor 211.

In an exemplary embodiment, the light-emitting device 103 may include an anode 301, a pixel define layer 302, an organic light-emitting layer 303 and a cathode 304. The anode 301 is disposed on the planarization layer 205, and is connected to a drain electrode of the driving transistor 210 through a via hole provided on the planarization layer 205. The pixel define layer 302 is disposed on the anode 301 and the planarization layer 205, and the pixel define layer 302 is provided with a pixel opening exposing the anode 301. The organic light-emitting layer 303 is at least partially disposed in the pixel opening, and the organic light-emitting layer 303 is connected to the anode 301. The cathode 304 is disposed on the organic light-emitting layer 303, and the cathode 304 is connected to the organic light-emitting layer 303. The organic light-emitting layer 303 emits light of corresponding colors under driving by the anode 301 and the cathode 304.

In an exemplary embodiment, an encapsulation layer 104 may include a first encapsulation layer 401, a second encapsulation layer 402 and a third encapsulation layer 403 that are stacked. The first encapsulation layer 401 and the third encapsulation layer 403 may be made of an inorganic material, and the second encapsulation layer 402 may be made of an organic material. The second encapsulation layer 402 is disposed between the first encapsulation layer 401 and the third encapsulation layer 403 to ensure that external moisture cannot enter into the light-emitting device 103.

In an exemplary embodiment, the organic light-emitting layer 303 may at least include a hole injection layer, a hole transport layer, a light-emitting layer and a hole block layer which are stacked on the anode 301. In an exemplary embodiment, the hole injection layers of all sub-pixels may be connected together as a common layer. The hole transport layers of all sub-pixels may be connected together as a common layer. The light-emitting layers of adjacent sub-pixels may be slightly overlapped or separated from each other. The hole block layers thereof may be connected together as a common layer.

Figure 4:
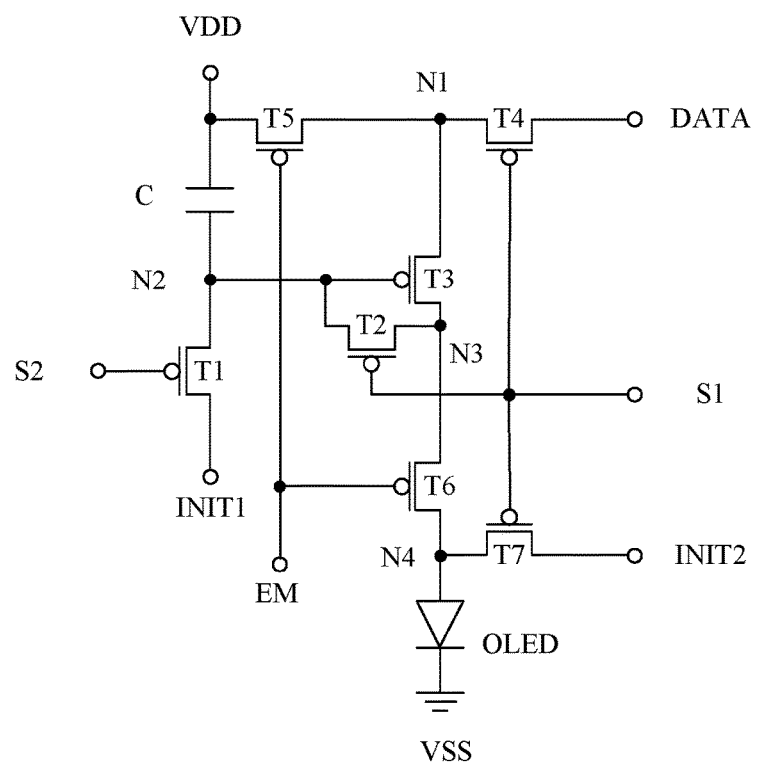
FIG. 4 is a schematic diagram of an equivalent circuit of a pixel drive circuit.

In an exemplary embodiment, the pixel drive circuit may have a structure of 3T1C, 4T1C, 5T1C, 5T2C, 6T1C or 7T1C. FIG. 4 is a schematic diagram of an equivalent circuit of a pixel drive circuit. As shown in FIG. 4, the pixel drive circuit may include 7 switching transistors (first transistor T1 to seventh transistor T7), 1 storage capacitor C and 8 signal lines (a data signal line DATA, a first scanning signal line S1, a second scanning signal line S2, a first initial signal line INIT1, a second initial signal line INIT2, a first power supply line VSS, a second power supply line VDD and a light-emitting signal line EM).

In an exemplary embodiment, a control electrode of the first transistor T1 is connected to the second scanning signal line S2, a first electrode of the first transistor T1 is connected to the first initial signal line INIT1, and a second electrode of the first transistor is connected to a second node N2. A control electrode of the second transistor T2 is connected to the first scanning signal line S1, a first electrode of the second transistor T2 is connected to the second node N2, and a second electrode of the second transistor T2 is connected to a third node N3. A control electrode of the third transistor T3 is connected to the second node N2, a first electrode of the third transistor T3 is connected to the first node N1, and a second electrode of the third transistor T3 is connected to the third node N3. A control electrode of the fourth transistor T4 is connected to the first scanning signal line S1, a first electrode of the fourth transistor T4 is connected to the data signal line DATA, and a second electrode of the fourth transistor T4 is connected to the first node N1. A control electrode of the fifth transistor T5 is connected to the light-emitting signal line EM, a first electrode of the fifth transistor T5 is connected to the second power supply line VDD, and a second electrode of the fifth transistor T5 is connected to the first node N1. A control electrode of the sixth transistor T6 is connected to the light-emitting signal line EM, a first electrode of the sixth transistor T6 is connected to the third node N3, and a second electrode of the sixth transistor T6 is connected to a first electrode of the light-emitting device. A control electrode of the seventh transistor T7 is connected to the first scanning signal line S1, a first electrode of the seventh transistor T7 is connected to the second initial signal line INIT2, and a second electrode of the seventh transistor T7 is connected to the first electrode of the light-emitting device. A first terminal of the storage capacitor C is connected to the second power supply line VDD, and a second terminal of the storage capacitor C is connected to the second node N2.

In an exemplary embodiment, a second electrode of the light-emitting device is connected to the first power supply line VSS. A signal on the first power supply line VSS is a low level signal, and a signal on the second power supply line VDD is a high level signal that is continuously supplied. The first scanning signal line S1 is a scanning signal line for a pixel drive circuit of a current display row, and the second scanning signal line S2 is a scanning signal line for a pixel drive circuit of a previous display row. That is, for a n-th display row, a first scanning signal line S1 is S(n), a second scanning signal line S2 is S(n−1), a second scanning signal line S2 of the current display row and the first scanning signal line S1 for the pixel drive circuit of the previous display row are the same signal line, which can reduce the signal lines of the display panel and achieve a narrow bezel of the display panel.

In an exemplary embodiment, the first transistor T1 to the seventh transistor T7 may be P-type transistors or may be N-type transistors. Adopting transistors of the same type in the pixel drive circuit may simplify a process flow, reduce difficulty in manufacturing processes of the display panel, and improve a product yield. In some possible implementations, the first transistor T1 to the seventh transistor T7 may include P-type transistors and N-type transistors.

In an exemplary embodiment, the first transistor T1 to the seventh transistors T7 may be low-temperature polysilicon thin film transistors, or oxide thin film transistors, or low-temperature polysilicon thin film transistors and oxide thin film transistors. An active layer of a low-temperature polysilicon thin film transistor is made of low-temperature polysilicon (LTPS), and an active layer of an oxide thin film transistor is made of oxide semiconductor. Low-temperature polysilicon thin film transistors have advantages such as high mobility and fast charging, while oxide thin film transistors have advantages such as low leakage current. The low-temperature polysilicon thin film transistors and the oxide thin film transistors are integrated on one display substrate to form a low-temperature polycrystalline oxide (LTPO) display substrate, and the advantages of both the low-temperature polysilicon thin film transistors and the oxide thin film transistors can be utilized to achieve low frequency drive, which reduces the power consumption and improves the display quality.

The present disclosure provides a display substrate, which includes a base substrate, an active structure layer disposed on the base substrate and a source-drain structure layer disposed on the active structure layer. The active structure layer includes a first active layer and a second active layer, wherein a material of the first active layer includes low-temperature polysilicon and a material of the second active layer includes oxide semiconductor. The source-drain structure layer includes a first source-drain electrode and a second source-drain electrode, wherein the first source-drain electrode overlaps with a first side surface of the first active layer through a first via hole and the second source-drain electrode overlaps with a second side surface of the second active layer through a second via hole. The first side surface is a surface parallel to the base substrate, and the second side surface is a surface intersecting with the base substrate.

In an exemplary embodiment, the active structure layer includes: a first insulating layer disposed on the base substrate, a first active layer disposed on the first insulating layer, a second insulating layer covering the first active layer, a first gate electrode disposed on the second insulating layer, a first gate electrode disposed on the second insulating layer, a third insulating layer covering the first gate electrode, a light shield layer disposed on the third insulating layer, a fourth insulating layer covering the light shield layer, a second active layer disposed on the fourth insulating layer, a fifth insulating layer covering the second active layer, a second gate electrode disposed on the fifth insulating layer, and a sixth insulating layer covering the second gate electrode. The second insulating layer, the third insulating layer, the fourth insulating layer, the fifth insulating layer and the sixth insulating layer in the first via hole are removed, making the first source-drain electrode overlap with the first side surface of the first active layer through the first via hole. The second active layer, the fifth insulating layer and the sixth insulating layer in the second via hole are removed, making the second source-drain electrode overlap with the second side surface of the second active layer through the second via hole.

In an exemplary embodiment, the second via hole includes a communication hole provided on the fifth and the sixth insulating layers and a contact hole provided on the second active layer, wherein the communication hole communicates with the contact hole, and the second source-drain electrode overlaps with the second side surface of the second active layer through the contact hole.

In an exemplary embodiment, at an interface between the second active layer and the fifth insulating layer, an orthographic projection of the contact hole at the interface on the base substrate includes an orthographic projection of the communication hole at the interface on the base substrate.

In an exemplary embodiment, at the interface between the second active layer and the fifth insulating layer, a distance between boundaries of the contact hole at the interface is a first distance, and a distance between boundaries of the communication hole at the interface is a second distance, wherein the first distance is greater than the second distance.

In an exemplary embodiment, the first distance is 1.01 to 1.05 times the second distance.

In an exemplary embodiment, an angle between the second side surface of the second active layer and the plane of the base substrate is 50 degrees to 70 degrees.

Figure 5:
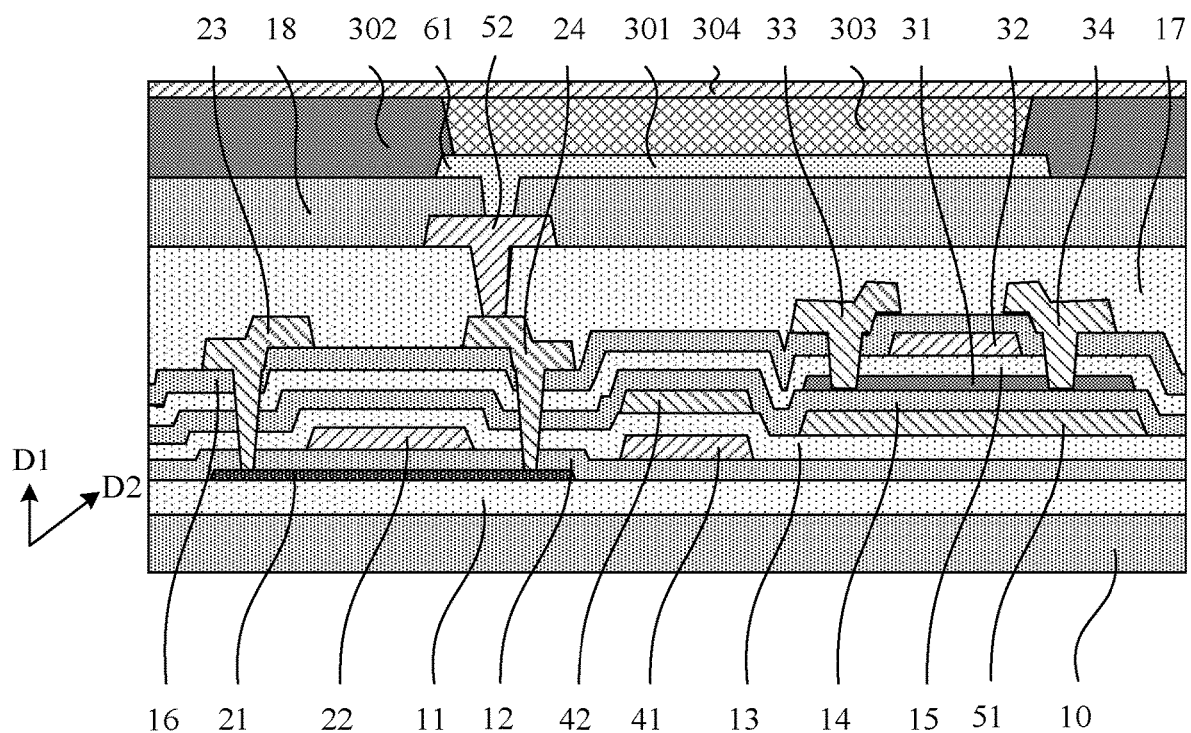
FIG. 5 is a schematic diagram of a structure of a display substrate according to an exemplary embodiment of the present disclosure.

FIG. 5 is a schematic diagram of a structure of a display substrate according to an exemplary embodiment of the present disclosure. As shown in FIG. 5, the display substrate may include a base substrate 10, an active structure layer disposed on the base substrate 10, a source-drain structure layer disposed on the active structure layer, and a light-emitting structure layer disposed on the source-drain structure layer.

In an exemplary embodiment, the active structure layer may include: a first insulating layer 11 disposed on the base substrate 10; a first semiconductor layer disposed on the first insulating layer 11, wherein the first semiconductor layer at least includes a first active layer 21; a second insulating layer 12 covering the first semiconductor layer; a first metal layer disposed on the second insulating layer 12, wherein the first metal layer at least includes a first gate electrode 22 and a first capacitor electrode 41; a third insulating layer 13 covering the first metal layer; a second metal layer disposed on the third insulating layer 13, wherein the second metal layer at least includes a second capacitor electrode 42 and a light shield layer 51; a fourth insulating layer 14 covering the second metal layer; a second semiconductor layer disposed on the fourth insulating layer 14, wherein the second semiconductor layer at least includes a second active layer 31; a fifth insulating layer 15 covering the second semiconductor layer; a third metal layer disposed on the fifth insulating layer 15, wherein the third metal layer at least includes a second gate electrode 32; and a sixth insulating layer 16 covering the third metal layer. The first via hole is disposed on the second insulating layer 12, the third insulating layer 13, the fourth insulating layer 14, the fifth insulating layer 15 and the sixth insulating layer 16, and exposes a surface of the first active layer 21 facing a first direction D1. The second via hole is disposed on the second active layer 31, the fifth insulating layer 15 and the sixth insulating layer 16, and exposes a surface of the second active layer 31 facing the second direction D2, wherein the first direction D1 intersects with the second direction D2. In an exemplary embodiment, the surface facing the first direction D1 is a surface parallel to the base substrate, that is, the first side surface. The surface facing the second direction D2 is a surface intersecting with the base substrate, that is, the second side surface. In an exemplary embodiment, an included angle between the first direction D1 and the second direction D2 may be greater than 0 degrees and less than 90 degrees.

In an exemplary embodiment, the source-drain structure layer may include: a fourth metal layer disposed on the sixth insulating layer 16, wherein the fourth metal layer at least includes a first source electrode 23, a first drain electrode 24, a second source electrode 33, and a second drain electrode 34. The first source electrode 23 and the first drain electrode 24 respectively overlaps with the surface of the first active layer 21 facing the first direction D1 through the first via hole, and the second source electrode 33 and the second drain electrode 34 respectively overlaps with the surface of the second active layer 31 facing the second direction D2 through the second via hole; a first planarization layer 17 covering the fourth metal layer, on which a first planarization via hole exposing the first drain electrode 14 is provided; a fifth metal layer formed on the first planarization layer 17, wherein the fifth metal layer at least includes a connection electrode 52, and the connection electrode 52 is connected to the first drain electrode 14 through a first planarization via hole; a second planarization layer 18 covering the fifth metal layer, on which a second planarization via hole exposing the connection electrode 52 is provided.

In an exemplary embodiment, the light-emitting structure layer may include: an anode 301 disposed on the second planarization layer 18 and a pixel define layer 302 disposed on the anode 301, wherein the pixel define layer 302 is provided with a pixel opening exposing a surface of the anode 301. The light-emitting structure layer may further include an organic light-emitting layer 303 disposed in the pixel opening, and a cathode 304 disposed on the organic light-emitting layer 303.

In an exemplary embodiment, the second via hole may include a communication hole provided on the fifth insulating layer 15 and the sixth insulating layer 16 and a contact hole provided on the second active layer 31. The communication hole communicate with the contact hole and the contact hole exposes the surface of the second active layer 31 facing the second direction D2.

In an exemplary embodiment, the included angle between the surface of the second active layer 31 facing the second direction D2 and the plane of the base substrate 10 is 50 to 70 degrees.

In an exemplary embodiment, a material of the first active layer 21 may include low-temperature polysilicon, and a material of the second active layer 31 may include an oxide semiconductor.

In an exemplary embodiment, the second active layer may have a thickness of about 300 Å to 500 Å.

The following is an exemplary explanation through a manufacturing process of the display substrate. The "patterning process" described in the present disclosure includes processes such as photoresist coating, mask exposure, development, etching and photoresist strip for metal materials, inorganic materials or transparent conductive materials, and includes processes such as organic material coating, mask exposure and development for organic materials. Deposition may include any one or more of sputtering, vapor deposition and chemical vapor deposition, coating may include any one or more of spraying coating, spin coating and ink-jet printing, and etching may include any one or more of dry etching and wet etching, which are not limited in the present disclosure. A "thin film" refers to a layer of thin film manufactured by a certain material on a base substrate using deposition, coating or other processes. If the "thin film" does not need the patterning process throughout the entire manufacturing process, the "thin film" may also be referred to as a "thin film" before the patterning process, and referred to as a "layer" after the patterning process. If the "thin film" needs the patterning process throughout the entire manufacturing process, it is referred to as a "thin film" before the patterning process, and referred to as a "layer" after the patterning process. The "layer" after the patterning process contains at least one "pattern". "A and B are disposed on a same layer" described in the present disclosure refers that A and B are formed at the same time by a same patterning process, and a "thickness" of a film layer is a dimension of the film layer in a direction perpendicular to the display substrate. In the embodiments of the present disclosure, "an orthographic projection of A including an orthographic projection of B" or "an orthographic projection of B is located within the range of an orthographic projection of A" means that the boundary of the orthographic projection of B falls within the range of the boundary of the orthographic projection of A, or the boundary of the orthographic projection of A overlaps with the boundary of the orthographic projection of B.

FIGS. 6 to 22 are schematic diagrams showing a manufacturing process of a display substrate. In an exemplary embodiment, the manufacturing process of the display substrate may include the following operations.

(A1) A base substrate 10 is manufactured on a glass carrier plate 1. In an exemplary embodiment of the present disclosure, the base substrate 10 may include a first flexible material layer, a first inorganic material layer, a semiconductor layer, a second flexible material layer and a second inorganic material layer which are stacked on the glass carrier plate 1. Materials of the first flexible material layer and the second flexible material layer may be polyimide (PI), polyethylene terephthalate (PET) or polymer soft thin film after surface treatment, and materials of the first inorganic material layer and the second inorganic material layer may be silicon nitride (SiNx) or silicon oxide (SiOx) to improve the moisture and oxygen resistance capability of the base substrate. The first inorganic material layer and the second inorganic material layers may be referred to as barrier layers, and amorphous silicon (a-si) may be used as the material of the semiconductor layer. In an exemplary embodiment, taking a laminated structure PI1/Barrier1/a-si/PI2/Barrier 2 as an example, the manufacturing process may include: coating a layer of polyimide on the glass carrier plate 1 first, and forming a first flexible layer (PI1) after curing the layer of polyimide to form a film; subsequently, depositing a layer of barrier thin film on the first flexible layer to form a first barrier layer (Barrier 1) covering the first flexible layer; then depositing a layer of amorphous silicon thin film on the first barrier layer to form an amorphous silicon (a-si) layer covering the first barrier layer; then coating a layer of polyimide on the amorphous silicon layer, and forming a second flexible layer (PI2) after curing the layer of polyimide to form a film; then depositing a layer of barrier thin film on the second flexible layer to form a second barrier layer (Barrier 2) covering the second flexible layer, so as to complete the manufacturing of the base substrate 10.

Figure 6:
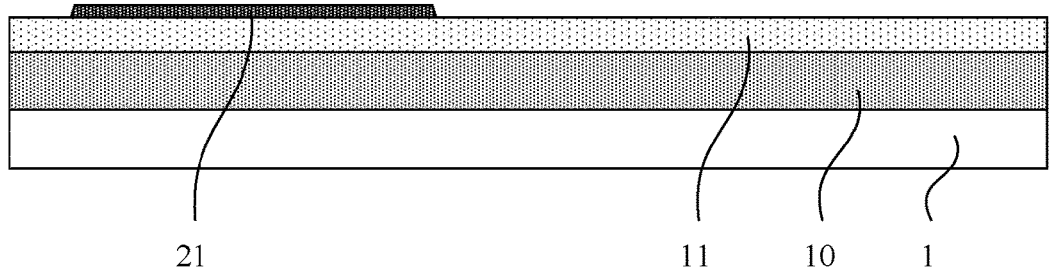
FIG. 6 is a schematic diagram after a pattern of a first active layer is formed according to an exemplary embodiment of the present disclosure.

(A2) A pattern of a first semiconductor layer is formed. In an exemplary embodiment, forming the pattern of the first semiconductor layer may include: sequentially depositing a first insulating thin film and a first semiconductor thin film on the base substrate 10, and patterning the first semiconductor thin film through a patterning process to form a first insulating layer 11 covering the entire base substrate 10 and the pattern of the first semiconductor layer disposed on the first insulating layer 11, wherein the pattern of the first semiconductor layer at least includes the first active layer 21, as shown in FIG. 6. In an exemplary embodiment, the first insulating layer may prevent substances in the base substrate from diffusing into other film layer structures in a subsequent process, which degrades the quality of the display substrate.

In an exemplary embodiment, patterning the first semiconductor thin film through the patterning process may include: forming an amorphous silicon (a-si) thin film on the first insulating thin film, dehydrogenating the amorphous silicon thin film, and crystallizing the dehydrogenated amorphous silicon thin film to form a polysilicon thin film. Subsequently, the polysilicon thin film is patterned to form the pattern of the first semiconductor layer. Since a large amount of hydrogen existing in amorphous silicon tend to cause defects in subsequent processes, it is necessary to perform the dehydrogenating process after forming the amorphous silicon thin film. A crystallization process is a process for crystallizing amorphous silicon to form polysilicon (p-si). For example, the crystallization process may be performed by an excimer laser anneal (ELA) process. Since the anneal process for forming polysilicon may damage the oxide, the manufacturing of the first active layer of low-temperature polysilicon is before the manufacturing of the second active layer of metal oxide.

Figure 7:
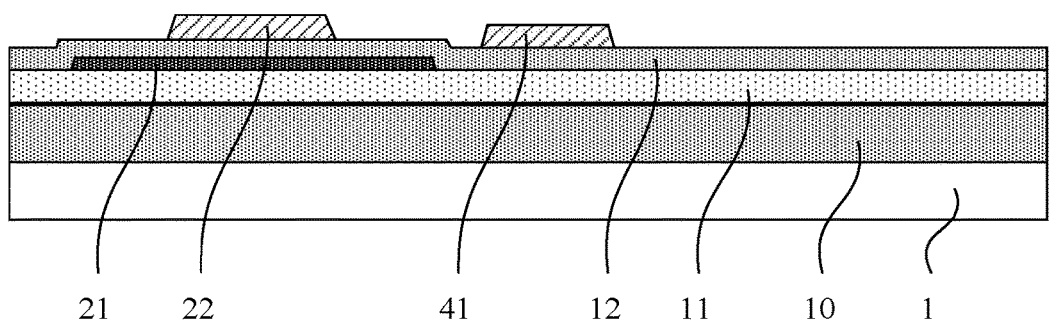
FIG. 7 is a schematic diagram after a pattern of a first metal layer is formed according to an exemplary embodiment of the present disclosure.

(A3) A pattern of a first metal layer is formed. In an exemplary embodiment, forming the pattern of the first metal layer may include: sequentially depositing a second insulating thin film and a first metal thin film on the base substrate on which the aforementioned patterns are formed, and patterning the first metal thin film through a patterning process to form a second insulating layer 12 covering the pattern of the first semiconductor layer and the pattern of the first metal layer disposed on the second insulating layer 12, wherein the pattern of the first metal layer at least includes a first gate electrode 22 and a first capacitor electrode 41, as shown in FIG. 7.

Figure 8:
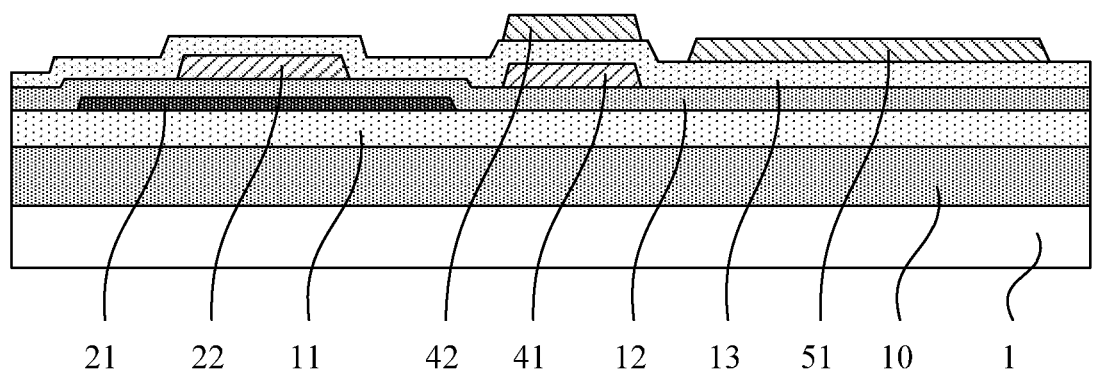
FIG. 8 is a schematic diagram after a pattern of a second metal layer is formed according to an exemplary embodiment of the present disclosure.

(A4) A pattern of a second metal layer is formed. In an exemplary embodiment, forming the pattern of the second metal layer may include: sequentially depositing a third insulating thin film and a second metal thin film on the base substrate on which the aforementioned patterns are formed, and patterning the second metal thin film through a patterning process to form a third insulating layer 13 covering the pattern of the first metal layer, and the pattern of the second metal layer disposed on the third insulating layer 13, wherein the pattern of the second metal layer at least includes a second capacitor electrode 42 and a light shield layer 51, as shown in FIG. 8. In an exemplary embodiment, a position of the second capacitor electrode 42 corresponds to a position of the first capacitor electrode 41, that is, an orthographic projection of the second capacitor electrode 42 on the base substrate overlaps with an orthographic projection of the first capacitor electrode 41 on the base substrate.

Figure 9:
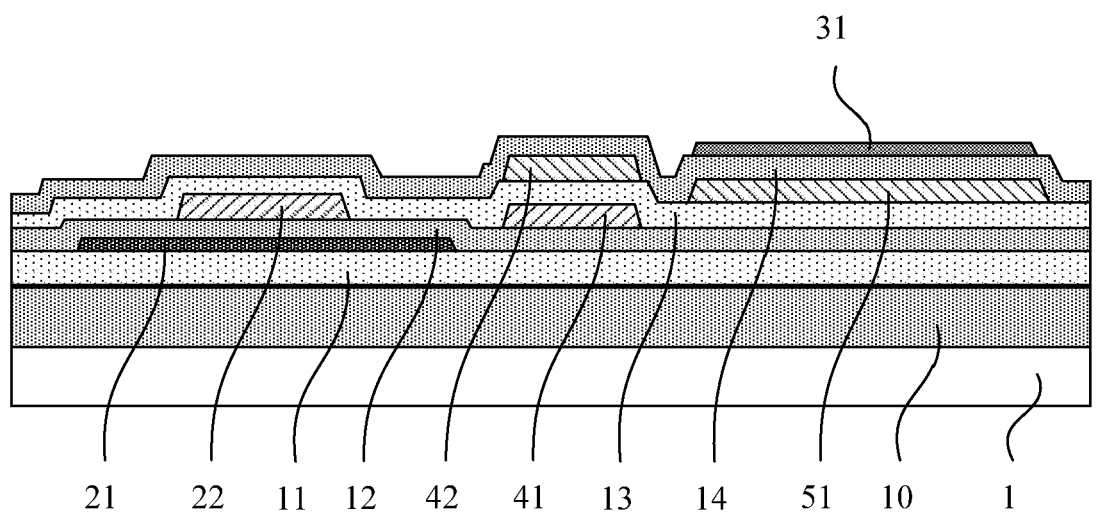
FIG. 9 is a schematic diagram after a pattern of a second active layer is formed according to an exemplary embodiment of the present disclosure.

(A5) A pattern of a second active layer is formed. In an exemplary embodiment, forming the pattern of the second active layer may include: sequentially depositing a fourth insulating thin film and a second semiconductor thin film on the base substrate on which the aforementioned patterns are formed, and patterning the second semiconductor thin film through a patterning process to form a fourth insulating layer 14 covering the entire base substrate 10 and a pattern of a second semiconductor layer disposed on the fourth insulating layer 14. The pattern of the second semiconductor layer at least includes the second active layer 13, as shown in FIG. 9. In an exemplary embodiment, a position of the second active layer 31 corresponds to a position of the light shield layer 51, that is, an orthographic projection of the second active layer 31 on the base substrate is within the range of an orthographic projection of the light shield layer 51 on the base substrate. In an exemplary embodiment, the second semiconductor thin film may be made of an oxide, which may be any one or more of indium gallium zinc oxide (InGaZnO), indium gallium zinc oxynitride (InGaZnON), zinc oxide (ZnO), zinc oxynitride (ZnON), zinc tin oxide (ZnSnO), cadmium tin oxide (CdSnO), gallium tin oxide (GaSnO), titanium tin oxide (TiSnO), copper aluminum oxide (CuAlO), strontium copper oxide (SrCuO), lanthanum copper oxysulfide (LaCuOS), gallium nitride (GaN), indium gallium nitride (InGaN), aluminum gallium nitride (AlGaN) and indium gallium aluminum nitride (InGaAlN). In some possible implementations, the second semiconductor thin film may be made of indium gallium zinc oxide (IGZO), wherein the indium gallium zinc oxide (IGZO) has higher electron mobility than amorphous silicon.

In an exemplary embodiment, a distance between the second active layer 31 and the base substrate is greater than a distance between the first active layer 21 and the base substrate.

In an exemplary embodiment, the fourth insulating layer 14 may have a thickness of about 2500 Å to 3500 Å. In some possible implementations, the fourth insulating layer 14 may have a thickness of about 2800 Å to 3200 Å.

In an exemplary embodiment, the second active layer may have a thickness of about 300 Å to 500 Å. In some possible implementations, the second active layer 31 may have a thickness of about 350 Å to 450 Å.

Figure 10:
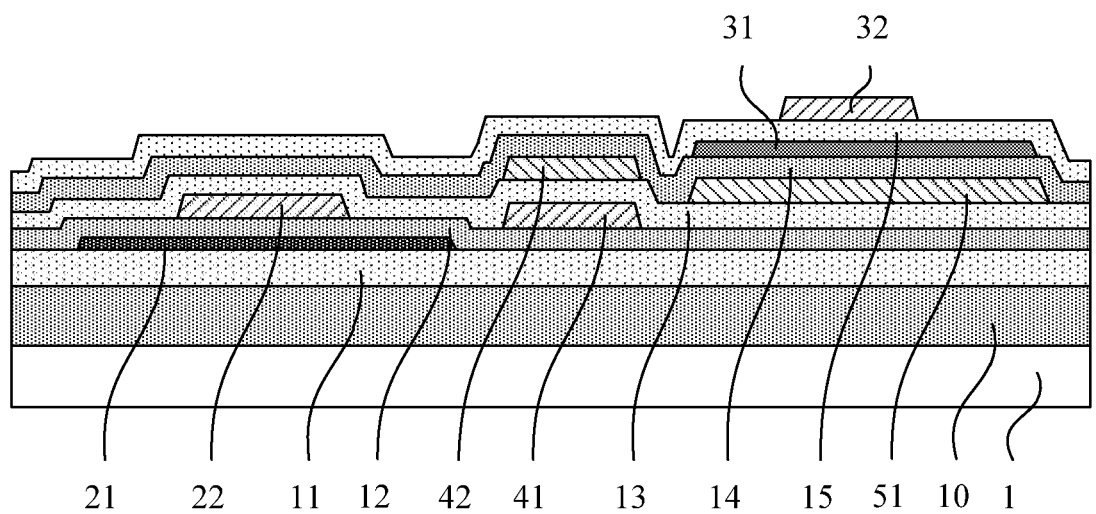
FIG. 10 is a schematic diagram after a pattern of a third metal layer is formed according to an exemplary embodiment of the present disclosure.

(A6) A pattern of a third metal layer is formed. In an exemplary embodiment, forming the pattern of the third metal layer may include: sequentially depositing a fifth insulating thin film and a third metal thin film on the base substrate on which the aforementioned patterns are formed, patterning the third metal thin film through a patterning process to form a fifth insulating layer 15 covering the second semiconductor layer and the pattern of the third metal layer disposed on the fifth insulating layer 15. The pattern of the third metal layer at least includes the second gate electrode 32, as shown in FIG. 10.

In an exemplary embodiment, the third metal layer may have a thickness of about 2000 Å to 3000 Å. In some possible implementations, the third metal layer may have a thickness of about 2300 Å to 2700 Å.

(A7) A pattern of a sixth insulating layer is formed. In an exemplary embodiment, forming the pattern of the sixth insulating layer may include: depositing a sixth insulating thin film on the base substrate on which the aforementioned patterns are formed, and patterning the sixth insulating thin film through a patterning process to form the pattern of the sixth insulating layer 16 covering the pattern of the third metal layer and multiple via holes, wherein the multiple via holes may include: first via holes K1 respectively located at two ends of the first active layer 21, and communication holes K2 respectively located at two ends of the second active layer 31. In an exemplary embodiment, the sixth insulating layer 16 may have a thickness of about 4500 Å to 6500 Å. In some possible implementations, the sixth insulating layer 16 may have a thickness of about 5000 Å to 6000 Å.

Figure 11:
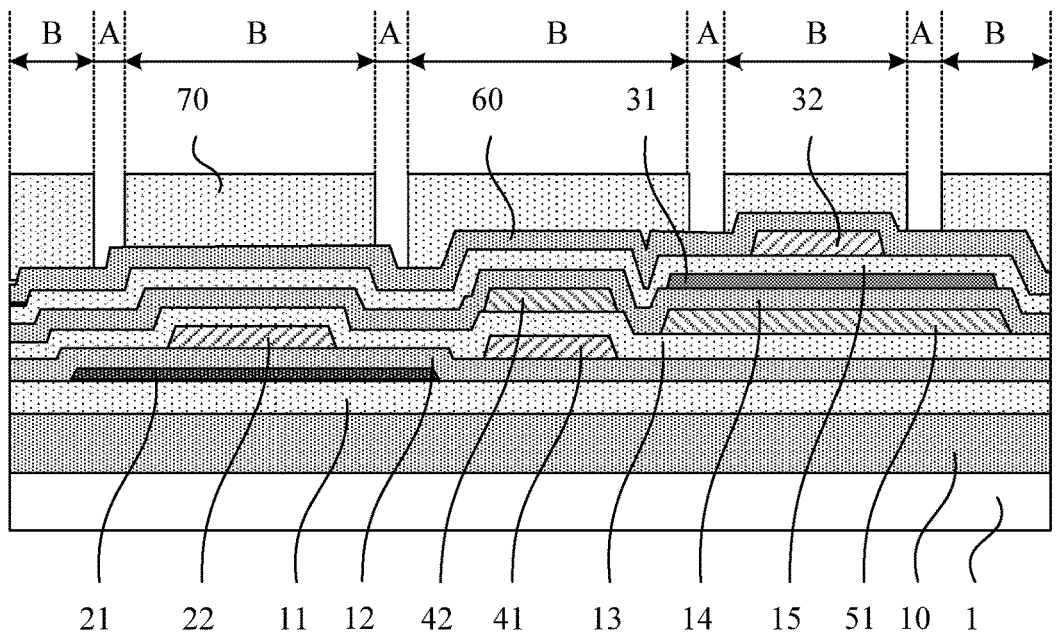
FIG. 11 is a schematic view after an exposure and development process according to an exemplary embodiment of the present disclosure.
Figure 12:
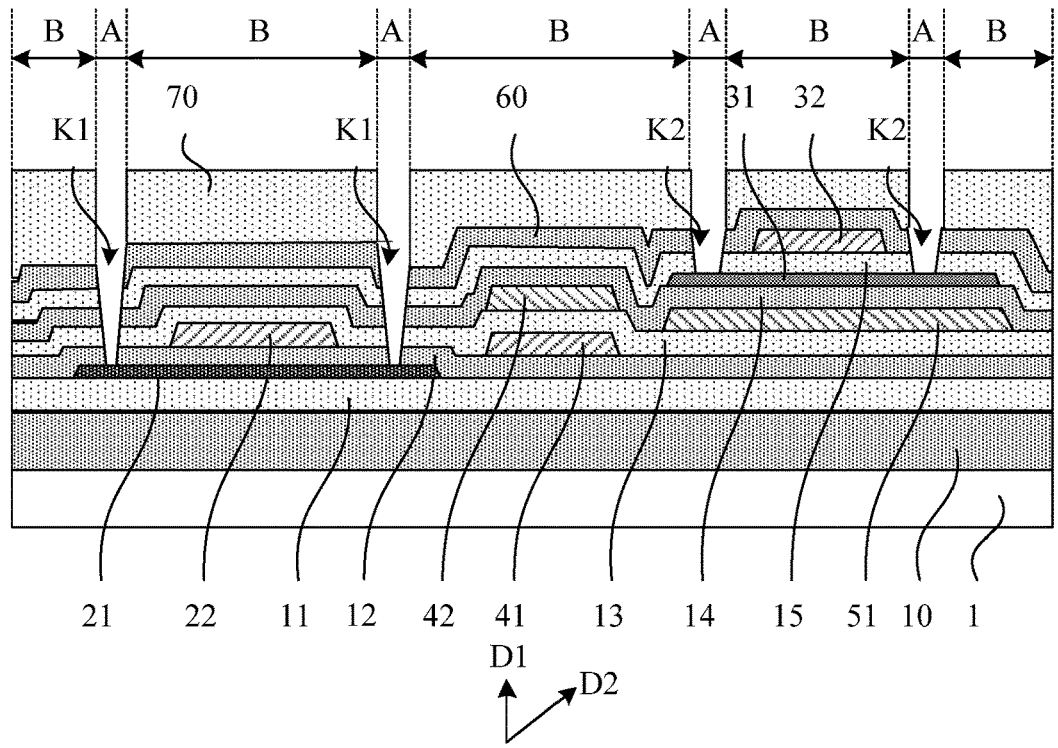
FIG. 12 is a schematic view after an etching process according to an exemplary embodiment of the present disclosure.

In an exemplary embodiment, forming multiple via holes through a patterning process may include:

a1, an exposure and development process is performed. In an exemplary embodiment, performing the exposure and development process may include: coating a layer of photoresist 70 on the sixth insulating thin film 60, exposing the photoresist 70 with a common mask, forming an exposed region A and an unexposed region B after development, removing the photoresist in the exposed region A to expose the surface of the sixth insulating thin film 60, and keeping the photoresist in the unexposed region B, as shown in FIG. 11.

a2, a dry etching process is performed. In an exemplary embodiment, performing the dry etching process may include: etching the film layer in the exposed region A by using a dry etching process, forming the first via holes K1 at the two ends of the first active layer 21 respectively, forming the communication holes K2 at the two ends of the second active layer 31; the sixth insulating layer 16, the fifth insulating layer 15, the fourth insulating layer 14, the third insulating layer 13 and the second insulating layer 12 in the first via holes K1 are etched away, exposing a surface (first side surface) of the first active layer 21 facing the first direction D1, and the sixth insulating layer 16 and the fifth insulating layer 15 in the communication holes K2 are etched away, exposing and a surface (first side surface) of the second active layer 31 facing the first direction D1, as shown in FIG. 12.

Figure 13:
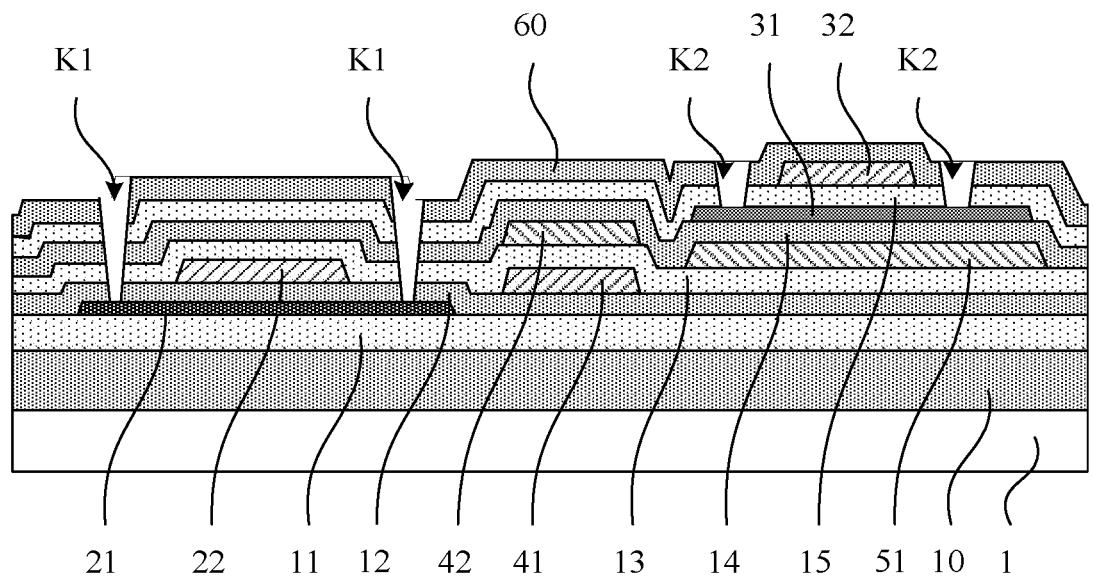
FIG. 13 is a schematic view after a strip process according to an exemplary embodiment of the present disclosure.
Figure 14:
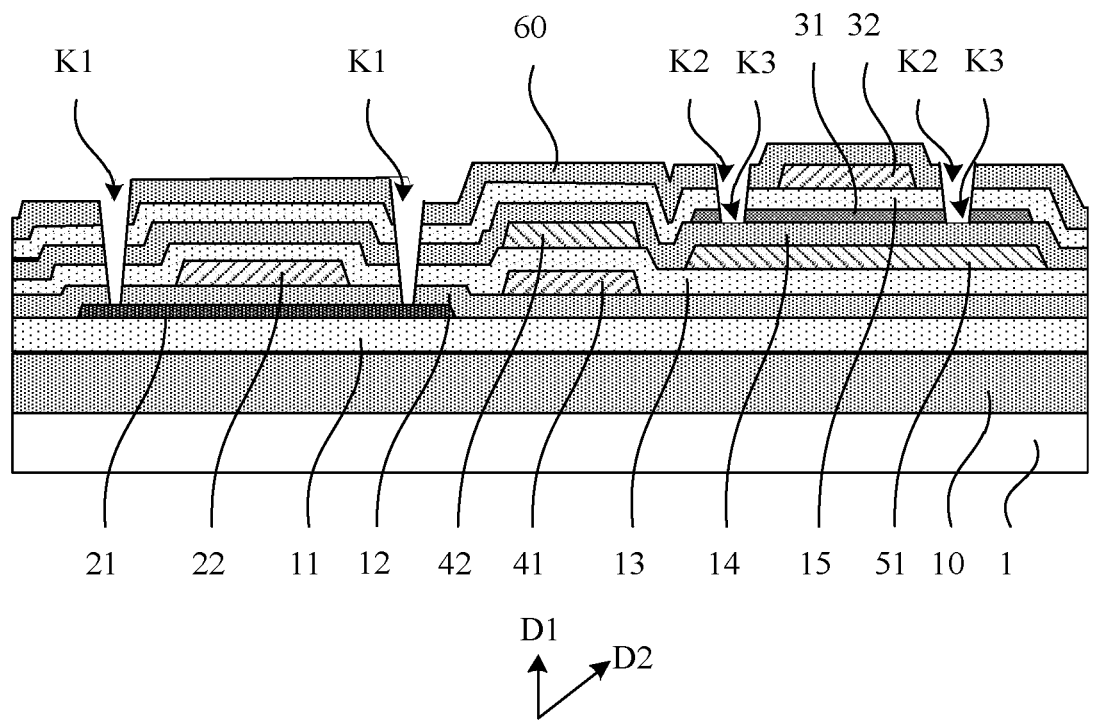
FIG. 14 is a schematic view after a cleaning process according to an exemplary embodiment of the present disclosure.

In an exemplary embodiment, a mixed fluorine-containing gas and an auxiliary gas may be used as etching gas of the dry etching process, wherein fluorine-containing gas may be tetrafluoromethane (CF4), sulfur hexafluoride (SF6) or the above-mentioned mixed gas, and auxiliary gas may be argon (Ar), and etching time may be about 220 seconds to 330 seconds. In some possible implementations, the etching time may be about 270 seconds to 290 seconds, such as 280 seconds.

a3, a strip process is performed. In an exemplary embodiment, the remaining photoresist may be removed by a strip process, as shown in FIG. 13.

a4, an anneal process is performed. In an exemplary embodiment, a high temperature anneal process may be used as the anneal process, which improves the material characteristics of the first active layer 21 and the second active layer 31 and improves the electrical performance of the transistors. In an exemplary embodiment, the temperature of the high temperature anneal process is about 350° C. to 400° C., for example, about 370° C.

a5, a cleaning process is performed. In an exemplary embodiment, performing the cleaning process may include removing oxide on the surface of the first active layer 21 in the first via holes K1 by using a cleaning solution, and simultaneously etching the second active layer 31 exposed in the communication holes K2. The second active layer 31 in the communication holes K2 is removed through the cleaning process, and contact holes K3 are formed on the second active layer 31, which communicates with the communication holes K2 and exposes the surface (second side surface) of the second active layer 31 facing the second direction D2, and a communication hole K2 and a contact hole K3 constitute a second via hole, as shown in FIG. 14.

In an exemplary embodiment, the cleaning solution in the cleaning process may be buffered oxide etch (BOE), and the BOE may include hydrogen fluoride (HF) and ammonium fluoride (NH4F), with the mass fraction of the hydrogen fluoride being about 0.2% to 3% and the mass fraction of the ammonium fluoride being about 30% to 40%. The cleaning process can not only clean the surface of the first active layer facing the first direction D1 and improve the connection quality between the first active layer and the first source electrode and the first drain electrode which are to be formed subsequently, but also etch the second active layer to form contact holes on the surface of the second active layer facing the second direction D2, so that the second active layer is connected with the second source electrode and the second drain electrode which are to be formed subsequently through side walls of the contact holes. Because the second active layer is etched with the cleaning solution (wet etching method), surface quality of the sidewalls of the contact holes on the second active layer is improved, so that a lap resistance of side contact of the second source electrode and the second drain electrode with the second active layer has the same or similar resistance as a lap resistance of the front surface contact.

Figure 15:
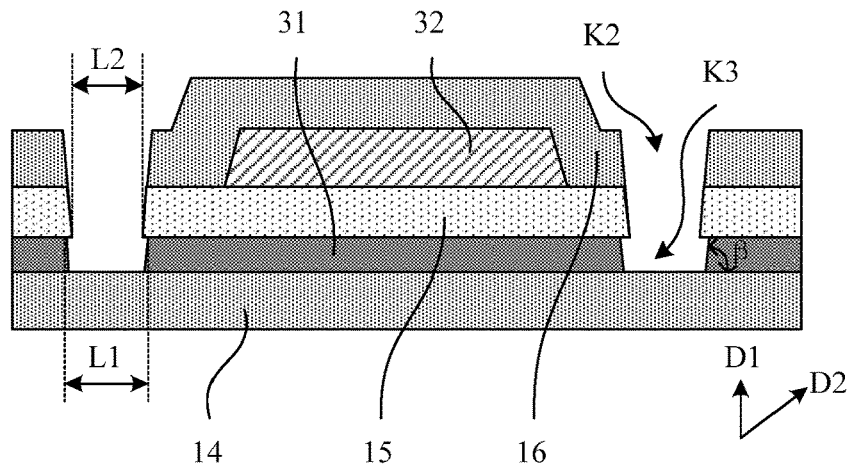
FIG. 15 is a schematic diagram of contact holes on the second active layer according to an exemplary embodiment of the present disclosure.

FIG. 15 is a schematic diagram of a contact hole on the second active layer according to an exemplary embodiment of the present disclosure. As shown in FIG. 15, the sixth insulating layer 16 and the fifth insulating layer 15 in the communication hole K2 are etched away, the second active layer 31 in the contact hole K3 is etched away, wherein the contact hole K3 communicates with the communication hole K2. In this way, the contact hole K3 exposes the surface of the second active layer 31 facing the second direction D2, and the surface of the second active layer 31 facing the second direction D2 forms an annular sidewall for overlapping. In an exemplary embodiment, an included angle β between the sidewall for overlapping and the plane of the base substrate may be about 50 to 70 degrees, that is, an included angle between the first direction D1 and the second direction D2 may be about 50 to 70 degrees. In some possible implementations, the included angle β between the sidewall for overlapping and the plane of the base substrate may be about 55 degrees to 60 degrees, such as 58 degrees.

In an exemplary embodiment, a generatrix of the annular sidewall for overlapping formed by the contact hole K3 may be a straight line or an arc protruding toward the outside of the contact hole K3.

In an exemplary embodiment, the communication hole K2 is dry etched, and the contact hole K3 is etched with a cleaning solution, that is, the second via hole is formed by an etching method with dry etching and wet etching combined. Due to isotropy of the etching with cleaning solution, the cleaning solution etches in both the first direction D1 and the second direction D2, so that the formed contact hole K3 is larger. In an exemplary embodiment, at an interface between the second active layer 31 and the fifth insulating layer 15, an orthographic projection of the contact hole K3 on the base substrate includes an orthographic projection of the communication hole K2 on the base substrate.

In an exemplary embodiment, at the interface between the second active layer 31 and the fifth insulating layer 15 (an interface between the communication hole K2 and the contact hole K3), a distance between boundaries on two sides of the contact hole K3 at the interface is a first distance L1, and a distance between boundaries on two sides of the communication hole K2 at the interface is a second distance L2, wherein the first distance L1 is greater than the second distance L2.

In an exemplary embodiment, the first distance L1 may be about 1.01 to 1.05 times the second distance L2. For example, the first distance L1 may be about 2.46 μm, and the second distance L2 may be about 2.39 μm.

Figure 16:
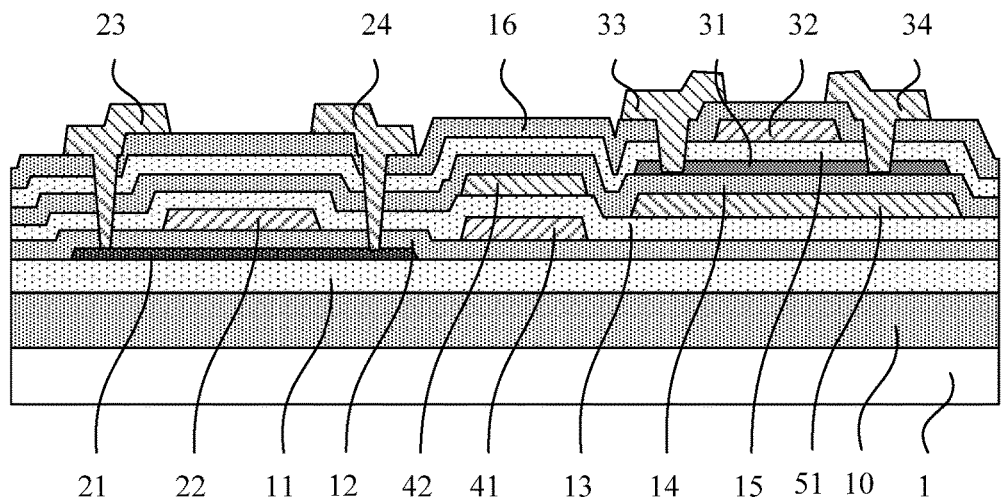
FIG. 16 is a schematic diagram after a pattern of a fourth metal layer is formed according to an exemplary embodiment of the present disclosure.

In an exemplary embodiment, (A8) A pattern of a fourth metal layer is formed. In an exemplary embodiment, forming the pattern of the fourth metal layer may include: depositing a fourth metal thin film on the base substrate on which the aforementioned patterns are formed, patterning the fourth metal thin film through a patterning process to form the pattern of the fourth metal layer on the sixth insulating layer 16, wherein the pattern of the fourth metal layer at least includes a first drain-source electrode and a second source-drain electrode. The first drain-source electrode may include a first source electrode 23 and a first drain electrode 24, and the second source-drain electrode may include a second source electrode 33 and a second drain electrode 34. The first source electrode 23 and the first drain electrode 24 are respectively connected to the first active layer 21 through the first via holes K1, and the second source electrode 33 and the second drain electrode 34 are respectively connected to the second active layer 31 through the communication holes K2 and the contact holes K3, as shown in FIG. 16.

In an exemplary embodiment, the first source electrode 23 and the first drain electrode 24 respectively overlap the surface of the first active layer 21 facing the first direction D1 (the first side surface away from the base substrate) to form a Just Contact connection mode. The second source electrode 33 and the second drain electrode 34 respectively overlap the surface (annular second side surface) of the second active layer 31 facing the second direction D2, forming a Side Contact connection mode.

Figure 17:
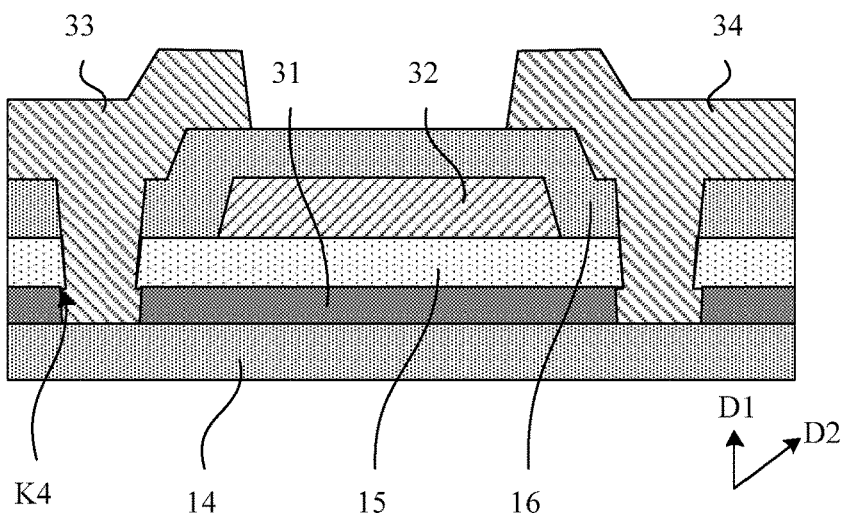
FIG. 17 is a schematic diagram of a side contact connection mode according to an exemplary embodiment of the present disclosure.

FIG. 17 is a schematic diagram of a side contact connection mode according to an exemplary embodiment of the present disclosure. As shown in FIG. 17, the second source electrode 33 is formed in the communication hole K2 and the contact hole K3. The annular sidewall for overlapping of the second source electrode 33 in the contact hole K3 directly contacts with the second source electrode 33 and the second drain electrode 34 to form an annular contact surface, thus the side contact connection mode is achieved. Since an aperture of the contact hole K3 is larger than an aperture of the communication hole K2, the second source electrode 33 and the second drain electrode 34 in the contact hole K3 are formed with a step K4 with respect to the second source electrode 33 and the second drain electrode 34 in the communication hole K2. In an exemplary embodiment, the step K4 can not only increase the bonding quality between the second source electrode 33 and the second drain electrode 34 with the second active layer 31 and reduce the contact resistance, but also improve the overlapping reliability between the second source electrode 33 and the second drain electrode 34 and the second active layer 31, and reduce the process difficulty.

In an exemplary embodiment, the fourth metal layer may have a thickness of about 7000 Å to 9000 Å. In some possible implementations, the fourth metal layer may have a thickness of about 7200 Å.

In an exemplary embodiment, the first active layer, the first gate electrode, the first source electrode and the first drain electrode form a first transistor which is a low-temperature polysilicon thin film transistor. The second active layer, the second gate electrode, the second source electrode and the second drain electrode form a second transistor which is an oxide thin film transistor. The first capacitor electrode and the second capacitor electrode form a storage capacitor, and the storage capacitor can compensate a threshold voltage of a driving transistor in a pixel drive circuit. In an exemplary embodiment, the first transistor may be the driving transistor in the pixel drive circuit, and the second transistor may be a switching transistor in the pixel drive circuit.

In an exemplary embodiment, the display substrate may include a display region and a bonding region located at one side of the display region, and the aforementioned drive circuit layer is arranged in the display region. In an exemplary embodiment, the bonding region may include a first fanout region, a bending region, a second fanout region, a driver chip region and a bonding pin region. The first fanout region 201 may be provided with a first power supply line, a second power supply line and multiple data transmission lines, wherein the multiple data transmission lines are configured to be connected with data line of the display region in a fanout trace manner, the first power supply line (VDD) is configured to be connected with a high-level power supply line of the display region 100, and the second power supply line (VSS) is configured to be connected with a low-level power supply lines of an edge region. The bending region may include a composite insulating layer disposed on the base substrate, wherein the composite insulating layer is provided with grooves for reducing the thickness of the bending region, which enables to bend the bonding region to the back of the display region. The second fanout region may be provided with multiple data transmission lines led out in a fanout trace manner. The driver chip region may be provided with a source Driver IC, which is configured to be connected with multiple data transmission lines of the second fanout region. The bonding pin region may be provided with multiple pins, which are configured to be connected to a flexible printed circuit board (FPC).

In an exemplary embodiment, the formation of the grooves of the bending region is synchronized with the formation of the first via holes and the communication holes aforementioned, that is, both of them are formed at the same time by a same patterning process. In an exemplary embodiment, all or part of the composite insulating layer in the grooves of the bending region is removed, and the composite insulating layer may include a first insulating layer 11, a second insulating layer 12, a third insulating layer 13, a fourth insulating layer 14, a fifth insulating layer 15, and a sixth insulating layer 16 stacked on the base substrate. The formation of the grooves of the bending region can reduce the thickness of the bending region and bend the bonding region to the back of the display region.

Figure 18:
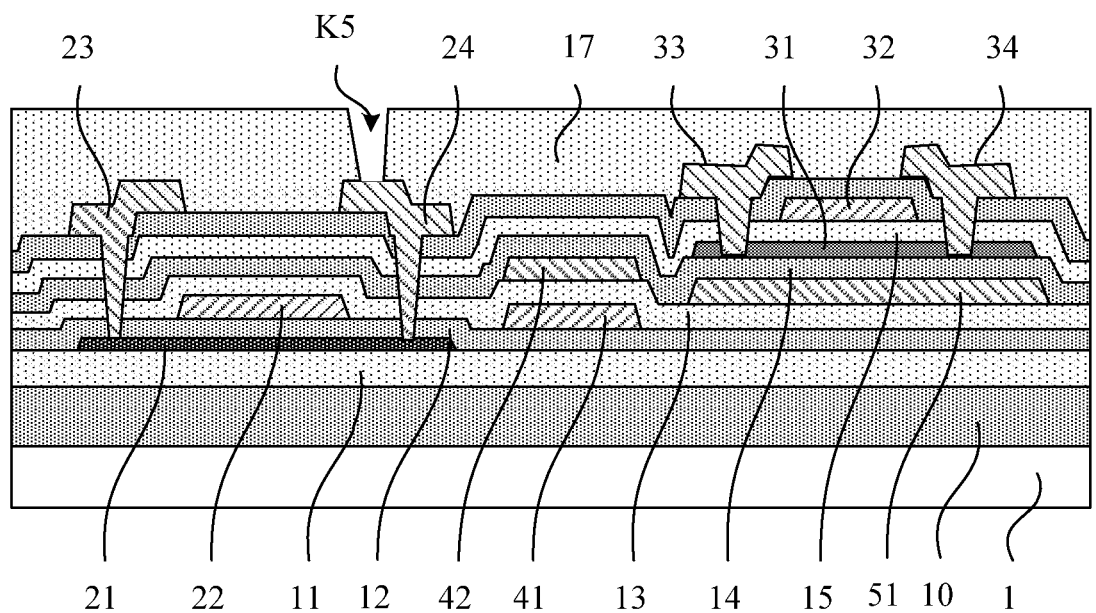
FIG. 18 is a schematic diagram after a pattern of a first planarization layer is formed according to an exemplary embodiment of the present disclosure.

(A9) A pattern of a first planarization layer is formed. In an exemplary embodiment, forming the pattern of the planarization layer may include: coating a first planarization thin film on the base substrate on which the aforementioned patterns are formed, patterning the first planarization thin film through a patterning process to form the pattern of the first planarization layer 17 covering the pattern of the fourth metal layer. A first planarization via hole K5 exposing the first drain electrode 14 is provided on the first planarization layer 17, as shown in FIG. 18. In an exemplary embodiment, a passivation (PVX) layer may be provided between the sixth insulating layer 16 and the first planarization layer 17.

Figure 19:
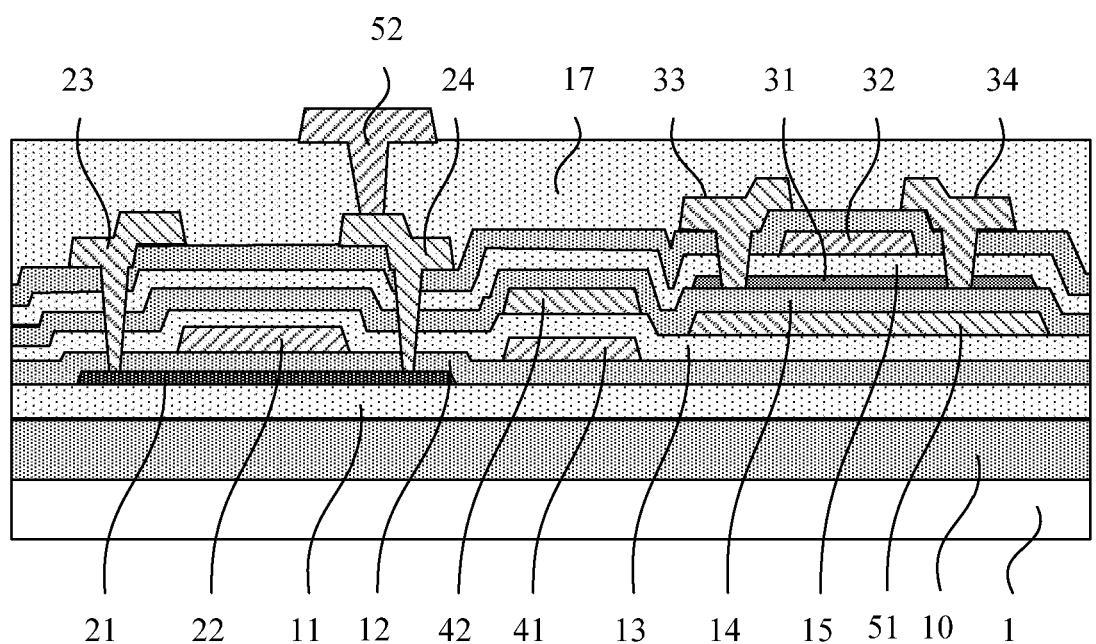
FIG. 19 is a schematic diagram after a pattern of a fifth metal layer is formed according to an exemplary embodiment of the present disclosure.

(A10) A pattern of a fifth metal layer is formed. In an example embodiment, forming the pattern of the fifth metal layer may include: depositing a fifth metal thin film on the base substrate on which the aforementioned patterns are formed, patterning the fifth metal thin film through a patterning process to form a pattern of the fifth metal layer on the first planarization layer 17. The pattern of the fifth metal layer at least includes a connection electrode 52, wherein the connection electrode 52 is connected to a first drain electrode 14 through the first planarization via hole K5, as shown in FIG. 19.

Figure 20:
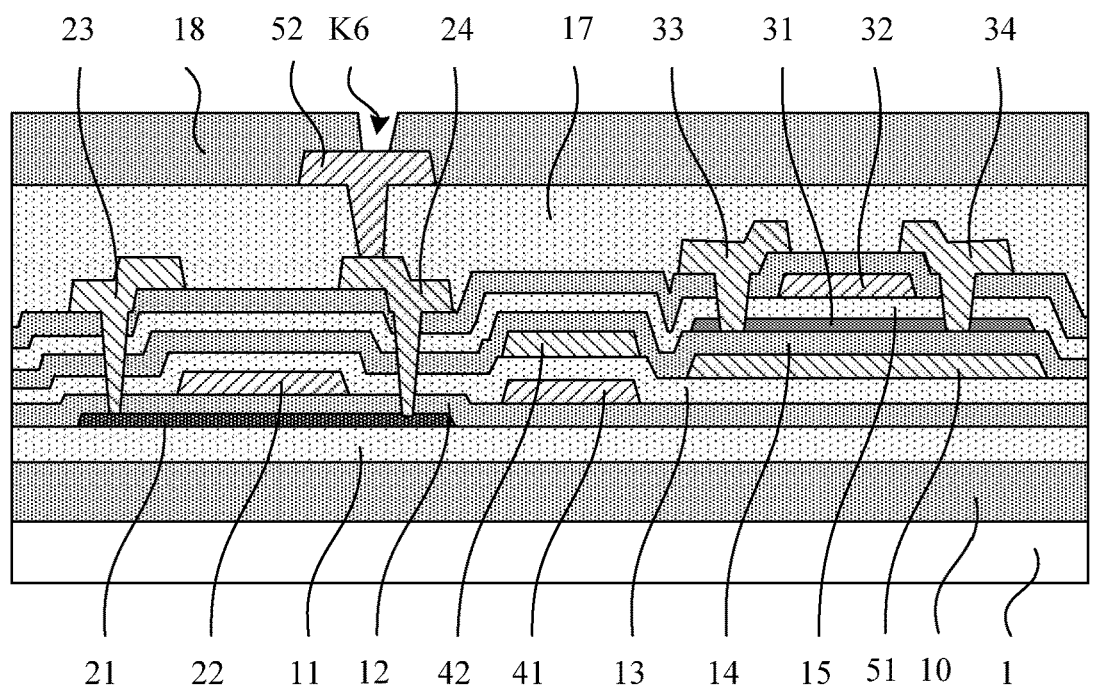
FIG. 20 is a schematic diagram after a pattern of a second planarization layer is formed according to an exemplary embodiment of the present disclosure.

(A11) A pattern of a second planarization layer is formed. In an exemplary embodiment, forming the pattern of the planarization layer may include: coating a second planarization thin film on the base substrate on which the aforementioned patterns are formed, patterning the second planarization thin film through a patterning process to form the pattern of the second planarization layer 18 covering the connection electrode 52. The second planarization layer 18 is provided with a second planarization via hole K6 exposing the connection electrode 52, as shown in FIG. 20.

Figure 21:
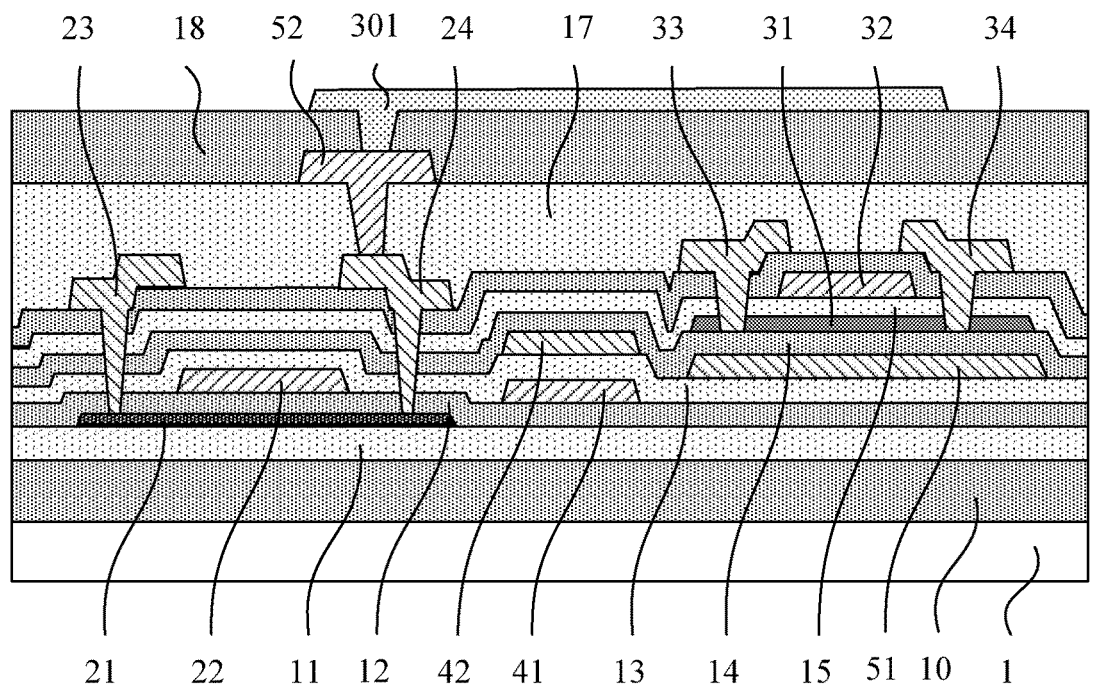
FIG. 21 is a schematic diagram after a pattern of an anode is formed according to an exemplary embodiment of the present disclosure.

(A12) A pattern of an anode is formed. In an exemplary embodiment, forming the pattern of the anode may include: depositing a transparent conductive thin film on the base substrate on which the aforementioned patterns are formed, patterning the transparent conductive thin film through a patterning process to form a pattern of an anode 301 on the second planarization layer 18, and the anode 301 is connected to the connection electrode 52 through the second planarization via hole K6, as shown in FIG. 21.

Figure 22:
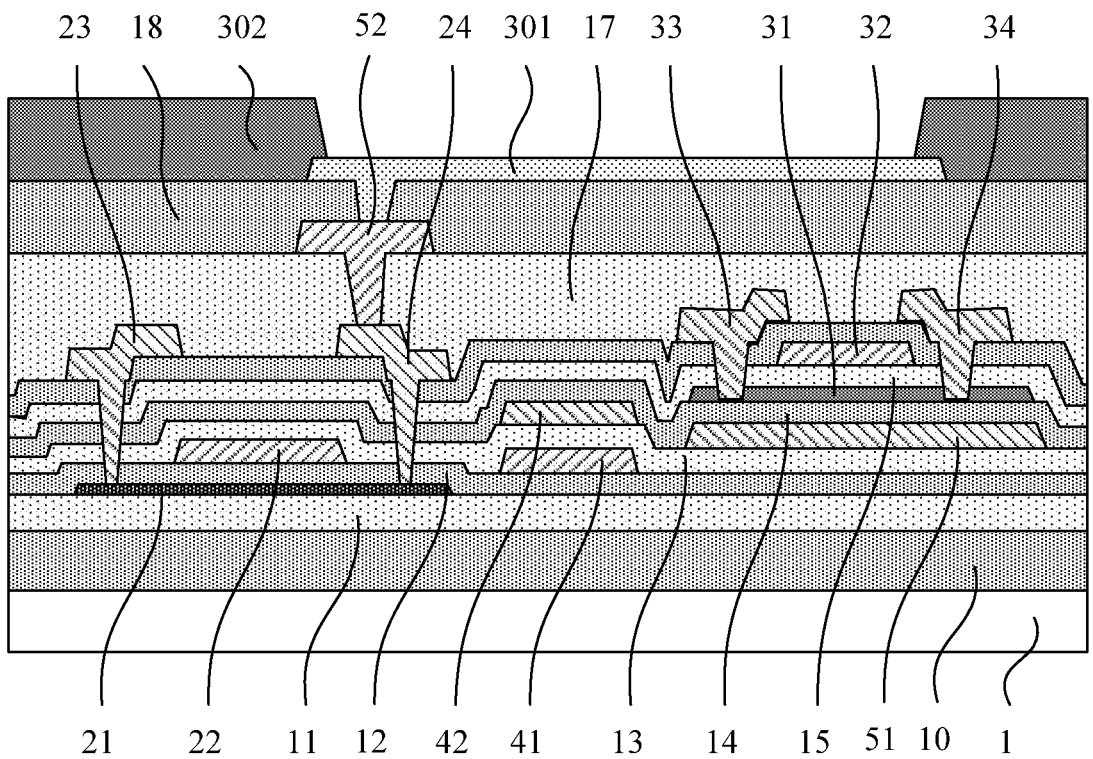
FIG. 22 is a schematic diagram after a pattern of a pixel define layer is formed according to an exemplary embodiment of the present disclosure.

(A13) A pattern of a pixel define layer is formed. In an exemplary embodiment, forming the pattern of the pixel define layer may include: coating a pixel define thin film on the base substrate on which the aforementioned patterns are formed, and patterning the pixel define thin film through a patterning process to form a pixel define layer 302. The pixel define layer 302 is provided with a pixel opening, and the pixel define thin film in the pixel opening is developed, exposing the surface of the anode 301, as shown in FIG. 22.

A subsequent manufacturing process may include sequentially forming an organic light-emitting layer 303, a cathode 304, and an encapsulation layer on the base substrate on which the aforementioned patterns are formed. An organic light-emitting layer is formed in the pixel opening, achieving the connection between the organic light-emitting layer and the anode. Since the anode is connected to the connection electrode, and the connection electrode is connected to the first drain electrode, the connection between the organic light-emitting layer and the first drain electrode is thereby achieved. The cathode is formed on the organic light-emitting layer and the pixel define layer, and the cathode is connected to the organic light-emitting layer. In an exemplary embodiment, the organic light-emitting layer may include a hole injection layer, a hole transport layer, a light-emitting layer, an electron transport layer, and an electron injection layer which are stacked. In an exemplary embodiment, the encapsulation layer may include a laminated structure of a first encapsulation layer, a second encapsulation layer, and a third encapsulation layer. The first encapsulation layer is made of an inorganic material, the second encapsulation layer is made of an organic material, and the third encapsulation layer is made of an inorganic material.

In an exemplary embodiment, the manufacturing process of the display substrate may further include stripping the display substrate from the glass carrier plate 1 through a strip process, attaching a layer of back film to a back surface of the display substrate (a side surface of the base substrate 10 away from the film layer) by roller bonding, cutting along a cutting groove by a cutting device, and the like.

In an exemplary embodiment, the first, second, third, fourth, fifth, and sixth insulating layers may be made of any one or more of silicon oxide (SiOx), silicon nitride (SiNx) and silicon oxynitride (SiON), and may be single layers, multiple layers or composite layers. The first insulating layer is referred to as a buffer layer for improving the moisture and oxygen resistance capability of the base substrate. The second, third, fourth, and the fifth insulating layers are referred to as gate insulating (GI) layers. The sixth insulating layer is referred to as an interlayer insulating (ILD) layer. The first, second, third, fourth and fifth metal thin films may be made of a metal material, such as any one or more of silver (Ag), copper (Cu), aluminum (Al), titanium (Ti) and molybdenum (Mo), or alloy materials of the above metals, such as aluminum neodymium alloy (AlNd) or molybdenum niobium alloy (MoNb), and may have a single-layer structure or a multi-layer composite structure, such as Ti/Al/Ti. The transparent conductive thin film may include indium tin oxide (ITO) or indium zinc oxide (IZO). The pixel define layer may be made of polyimide, acrylic, polyethylene terephthalate or the like. The cathode may be made of any one or more of magnesium (Mg), silver (Ag), aluminum (Al), copper (Cu) and lithium (Li), or an alloy made of any one or more of the above metals.

In an exemplary embodiment, the fourth metal layer may adopt a Ti/Al/Ti three-layer composite structure, and the aluminum layer is located between a first titanium layer and a second titanium layer, wherein the first titanium layer is located on a side of the aluminum layer adjacent to the base substrate and the second titanium layer is located on a side of the aluminum layer away from the base substrate. In an exemplary embodiment, the first titanium layer may have a thickness of about 600 Å to 800 Å, the aluminum layer may have a thickness of about 5000 Å to 7000 Å, and the second titanium layer may have a thickness of about 400 Å to 600 Å. In some possible implementations, the first titanium layer may have a thickness of about 700 Å, the aluminum layer may have a thickness of about 6000 Å, and the second titanium layer may have a thickness of about 500 Å.

In a display substrate, a first drain-source electrode and a first active layer are connected with each other in a front contact manner, and a second drain-source electrode and a second active layer are also connected with each other in a front contact manner. Because a depth of a via hole connected with the first active layer is quite different from a depth of a via hole connected with the second active layer, the synchronous etching process is very demanding and difficult, so different patterning processes are adopted to form the via hole connected with the first active layer through one patterning process and the via hole connected with the second active layer through another patterning process respectively, thus the number of patterning processes is large and the production cost is high.

In a display substrate provided by an exemplary embodiment of the present disclosure, by configuring the connection between the second source-drain electrode and the second active layer as a side contact connection mode, the via hole connected with the first active layer and the via hole connected with the second active layer can be simultaneously formed in the same patterning process, thereby reducing the number of patterning processes, simplifying the processes and saving the production cost. By adopting a combined etching process of dry etching first and cleaning solution etching later in the patterning process for forming via holes, the process is simple, which reduce the requirements on synchronous etching processes, as well as the requirements on loss of the second active layer in the simultaneous etching. This not only effectively achieves the simultaneous etching of the via hole connected with the first active layer and the via hole connected with the second active layer, but also helps to ensure the uniformity of the etching, and thus improves the product yield. Etching the second active layer with cleaning solution not only facilitates increasing the aperture of the contact hole but also improves the connection reliability between the second drain-source electrode and the second source electrode, but also improves the surface quality of the contact surface of the side contact connection of the second active layer, thereby increasing the overlapping quality between the second drain-source electrode and the second source electrode, and reducing the contact resistance, so that the overlapping resistance of the side contact and the overlapping resistance of the front contact have the same or similar resistance, so that the characteristics of low-temperature polysilicon thin film transistors and oxide thin film transistors are simultaneously improved. According to the manufacturing process of the display substrate of the exemplary embodiment of the disclosure, not only the difficulty of the processes and the requirements on the processes are greatly reduces, but also the processes are simple and process compatibility are good, which helps to ensure the uniformity of the etching, improving product yield while reducing production cost.

In a display substrate, after via holes are formed, an ashing process is adopted to remove an oxide layer in the via hole connected to the first active layer. Since there are a large number of particles after the ashing process, it is necessary to clean again before continuing the process, making the process complex and making the production cost high. In the display substrate provided by the exemplary embodiment of the present disclosure, the oxide layer in the via hole is removed by the cleaning process, and the second active layer is etched synchronously, thereby simplifying the processes and reducing the production cost.

In a display substrate provided by an exemplary embodiment of the present disclosure, the front contact connection mode is used for the polysilicon active layer and the side contact connection mode is used for the oxide active layer, which not only has simple implementation processes, reduces the requirements on synchronous etching processes, facilitates ensuring the etching uniformity and the improving yield, but also improves the connection reliability of the side contact connection mode, so that the overlapping resistance of the side contact and the overlapping resistance of the front contact have the same or similar resistance, thus simultaneously improving the characteristics of low-temperature polysilicon thin film transistors and oxide thin film transistors.

Figure 23:
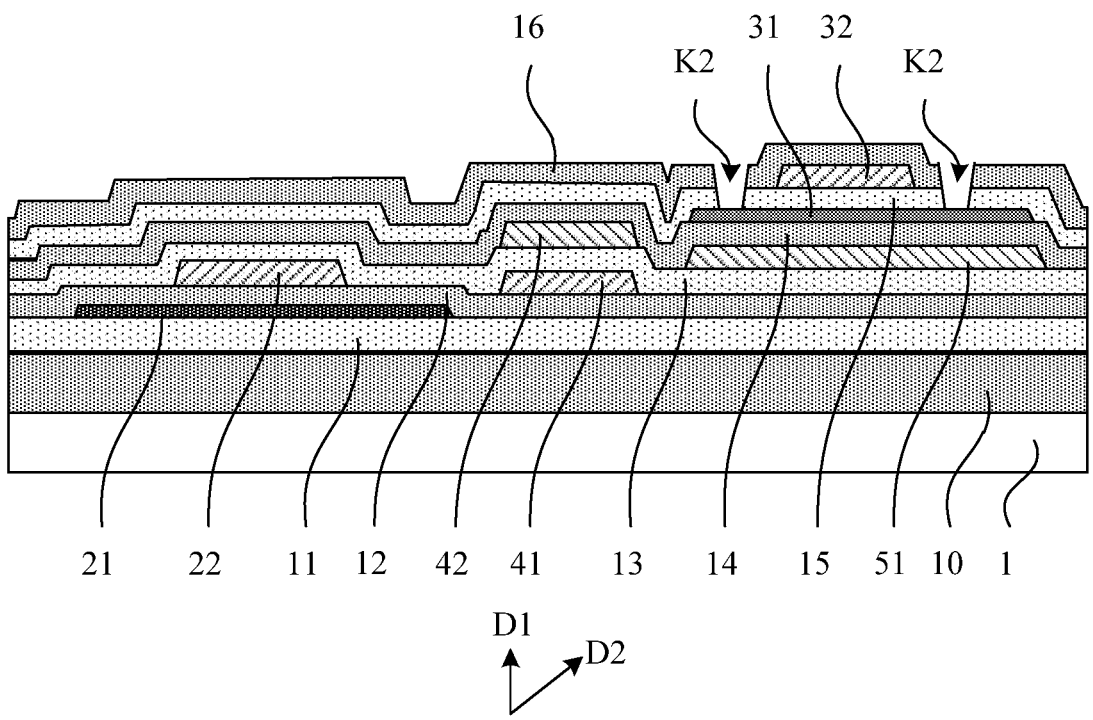
FIG. 23 is another schematic diagram after a pattern of contact holes is formed according to an exemplary embodiment of the present disclosure.
Figure 24:
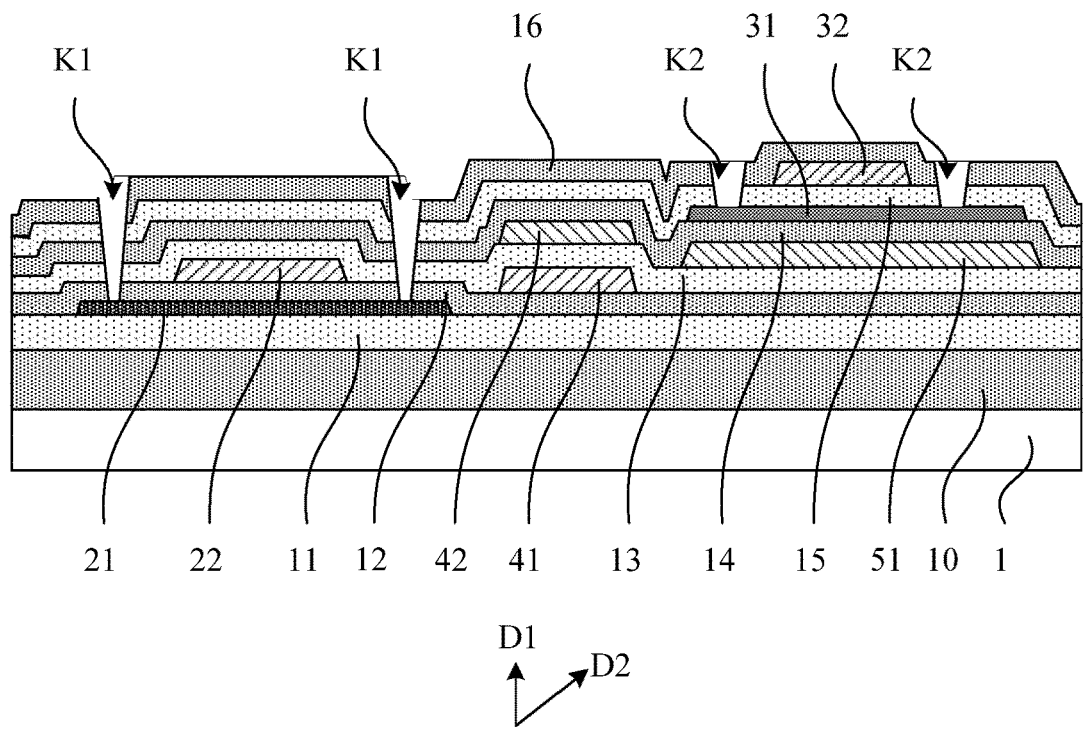
FIG. 24 is another schematic diagram after a pattern of first via holes is formed according to exemplary embodiment of the present disclosure.
Figure 25:
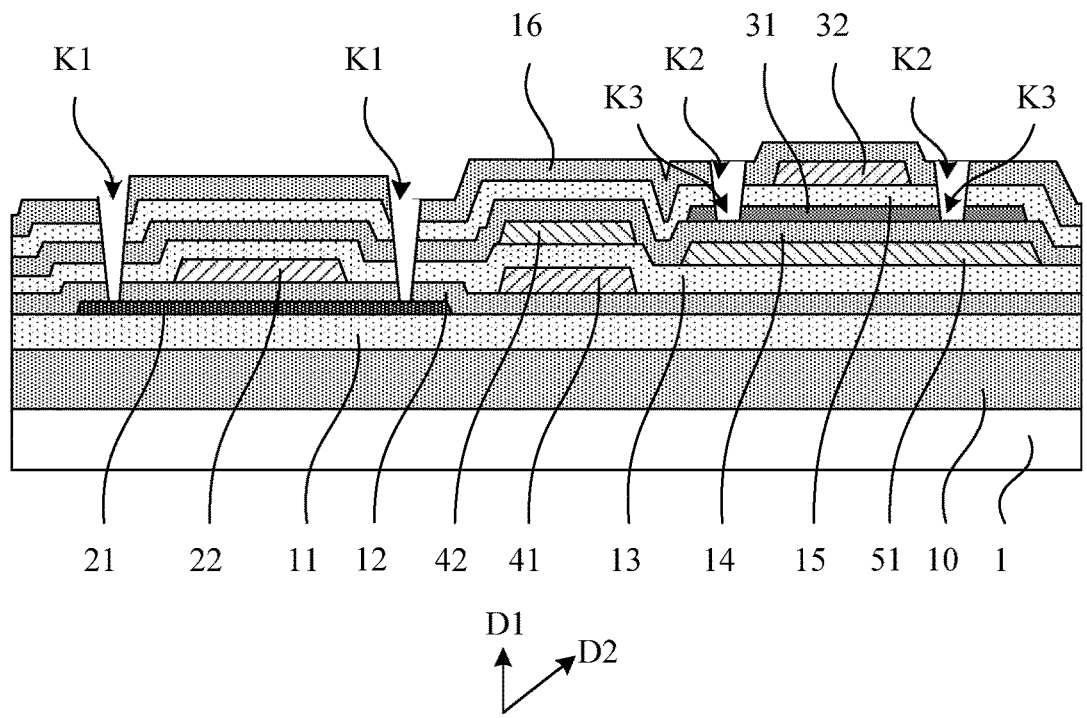
FIG. 25 is another schematic view after a cleaning process according to an exemplary embodiment of the present disclosure.

FIGS. 23 to 25 are schematic diagrams showing another manufacturing process of a display substrate. In an exemplary embodiment, the manufacturing process of the display substrate may include the following operations.

(B1) A base substrate is manufactured on a glass carrier plate, and a pattern of a first active layer, a pattern of a first metal layer, a pattern of a second metal layer, a pattern of a second active layer and a pattern of a third metal layer are sequentially disposed on the base substrate. In an exemplary embodiment, the manufacturing processes of these film layers may be the same as the manufacturing processes (A1) to (A6) of the previous embodiments, which will not be described in detail here.

(B2) Part of a pattern of via holes in the sixth insulating layer is formed. In an exemplary embodiment, forming the part of the pattern of the via holes in the sixth insulating layer may include: depositing a sixth insulating thin film on the base substrate on which the aforementioned patterns are formed, coating a layer of photoresist on the sixth insulating thin film, exposing the photoresist with a common mask, forming an exposed region and an unexposed region after development, removing the photoresist in the exposed region to expose a surface of the sixth insulating thin film. Then the film layer in the exposed region through an etching process is etched, and the remaining photoresist is stripped to form the pattern of the sixth insulating layer 16 covering the pattern of the third metal layer. Communication holes K2 exposing two ends of the second active layer 31 are formed on the sixth insulating layer 16, and the sixth insulating layer 16 and the fifth insulating layer 15 in the communication holes K2 are etched away, exposing a surface of the second active layer 31 facing the first direction D1, as shown in FIG. 23.

In an exemplary embodiment, a dry etching process may be adopted as the etching process. The etching gas of the dry etching process may be Argon (ar).

(B3) Another part of the pattern of via holes in the sixth insulating layer is formed. In an exemplary embodiment, forming the another part of the pattern of the via holes in the sixth insulating layer may include: coating a layer of photoresist on the sixth insulating thin film on the base substrate on which the aforementioned patterns are formed, exposing the photoresist with a common mask, forming an exposed region and an unexposed region after development, removing the photoresist in the exposed region to expose the surface of the sixth insulating layer 16. Then, the film layer in the exposed region through an etching process is etched, and the remaining photoresist is stripped to form first via holes K1 exposing two ends of the first active layer 21. The sixth insulating layer 16, the fifth insulating layer 15, the fourth insulating layer 14, the third insulating layer 13 and the second insulating layer 12 in the first via holes K1 are etched away, exposing the surface of the first active layer 21 facing the first direction D1, as shown in FIG. 24.

In an exemplary embodiment, a dry etching process may be adopted as the etching process. Oxygen ($O_2$) may be used as the etching gas in the dry etching process, and the etching time is 200 seconds to 300 seconds. In some possible implementations, the etching time may be about 240 seconds to 250 seconds, such as 245 seconds.

Then, an anneal process is performed to improve the material characteristics of the first active layer 21 and the second active layer 31 and improve the electrical performance of the transistors.

Then, a cleaning process is performed. In an exemplary embodiment, a cleaning solution may be used to remove the oxide on the surface of the first active layer 21 in the first via holes K1, and the second active layer 31 exposed in the via holes K2 is simultaneously etched away. The second active layer 31 in the communication hole K2 is removed through the cleaning process, and contact holes K3 are formed on the second active layer 31, wherein the contact holes K3 communicate with the communication holes K2 and exposes a surface of the second active layer 31 facing the second direction D2, as shown in FIG. 25.

In an exemplary embodiment, the cleaning solution in the cleaning process may be buffered oxide etch (BOE), which may include hydrogen fluoride (HF) and ammonium fluoride (NH4F). The cleaning process not only cleans the surface of the first active layer facing the first direction D1 and improves the connection quality between the first active layer and the first source electrode and the first drain electrode which are to be formed subsequently, but also etches the second active layer, forming a contact hole on the surface of the second active layer facing the second direction D2 and connecting the second active layer with the second source electrode and the second drain electrode which are to be formed subsequently through a side wall of the contact hole. Because the second active layer is etched with cleaning solution, the surface quality of the sidewall of the contact hole on the second active layer is improved, so that a lap resistance of the side contact of the second source electrode and the second drain electrode with the second active layer has the same or similar resistance as a lap resistance of the front surface contact.

(B4) A pattern of a fourth metal layer is formed. In an exemplary embodiment, forming the pattern of the fourth metal layer may include: depositing a fourth metal thin film on the base substrate on which the aforementioned patterns are formed, patterning the fourth metal thin film through a patterning process to form the pattern of the fourth metal layer on the sixth insulating layer 16, wherein the pattern of the fourth metal layer pattern at least includes a first drain-source electrode and a second source-drain electrode. The first drain-source electrode may include a first source electrode 23 and a first drain electrode 24, and the second source-drain electrode may include a second source electrode 33 and a second drain electrode 34. The first source electrode 23 and the first drain electrode 24 are respectively connected to the first active layer 21 through the first via holes K1, and the second source electrode 33 and the second drain electrode 34 are connected to the second active layer 31 through the communication holes K2 and the contact holes K3, respectively.

In an exemplary embodiment, the first source electrode 23 and the first drain electrode 24 respectively overlap the surface of the first active layer 21 facing the first direction D1 (the surface away from the base substrate) to form a Just Contact connection mode. The second source electrode 33 and the second drain electrode 34 respectively overlap the surface (annular sidewall for overlapping) of the second active layer 31 facing the second direction D2, forming a Side Contact connection mode.

Then, sequentially forming a first planarization layer, a fifth metal layer, a second planarization layer, an anode, a pixel define layer, an organic light-emitting layer, a cathode and an encapsulation layer. In an exemplary embodiment, the manufacturing processes of these film layers may be the same as the manufacturing processes (A9) to (A13) of the previous embodiments, and will not be described in detail here.

In an exemplary embodiment, the grooves of the bending region in the bonding region are formed in two times in step (B2) and step (B3). In an exemplary embodiment, in step (B2), the sixth insulating layer 16 and the fifth insulating layer 15 in the bending region may be etched away to form a second groove, which is referred to as an Etch Bending A MASK (EBA MASK for short) in step (B2). In step (B3), the fourth insulating layer 14, the third insulating layer 13, and the second insulating layer 12 in the bending region may be etched away to form a first groove, which is referred to as an Etch Bending B MASK (EBB MASK for short). In this way, the first groove and the second groove are formed in the bending region. The second groove exposes the first groove, and the first groove exposes the base substrate 10, thereby forming a stepped groove structure.

In a display substrate, a first source-drain electrode and a first active layer are in a front contact connection, and a second source-drain electrode and a second active layer are also in a front contact connection. The manufacturing process includes: first, forming a first via hole exposing the first active layer through a patterning process, performing a cleaning process of the via hole; then, forming a via hole exposing the second active layer through another patterning process; and then performing a patterning process for forming the fourth metal layer. The cleaning process is performed after the first via hole is formed because the cleaning solution of the cleaning process has etching effect on an oxide material of the second source electrode, thus the cleaning process needs to be performed before formation of the communication hole of the second active layer. Since the patterning process for forming the communication hole is included after the cleaning process and before the formation of the fourth metal layer, the process time for forming the communication hole should be strictly controlled in the process flow, this is because long time will lead to oxidation of the surface of the first active layer, which will affect the connection quality between the fourth metal layer and the first active layer, resulting in great process difficulty. In addition, because photoresist needs to be used in the patterning process for forming the communication hole, and the photoresist is filled in the first via hole, there is a risk of residual photoresist in the first via hole in this process flow, which affects the connection quality between the fourth metal layer and the first active layer, resulting in high requirements on the processes.

In a display substrate provided by an exemplary embodiment of the present disclosure, the connection between the second source-drain electrode and the second active layer is set in a side contact connection mode, which greatly reduces the difficulty of the process and the requirements on the processes. In the two patterning processes for forming via holes, due to the order of patterning of forming communication holes first and then forming first via holes and contact holes, the time interval between the cleaning process and the process for forming the fourth metal layer is very short. There is no need to strictly control the process time, which also greatly reduces the difficulty of processes, and can prevent the surface of the first active layer from being oxidized, thus ensuring the connection quality between the fourth metal layer and the first active layer. In the two patterning processes for forming the via holes, because contact holes are formed on the second active layer at the same time of cleaning the surface of the first active layer in the cleaning process, it not only eliminates the risk of residual photoresist in the first via holes, greatly reduces the requirements on the processes, but also improves the surface quality of the contact surface of the side contact connection of the second active layer, increases the overlapping quality between the second drain-source electrode and the second source electrode, and reduces the contact resistance, so that an overlapping resistance of the side contact and an overlapping resistance of the front contact have the same or similar resistance, thus the characteristics of low-temperature polysilicon thin film transistors and oxide thin film transistors are simultaneously improved. In the manufacturing process of the display substrate according to the exemplary embodiment of the disclosure, not only the difficulty of the processes and the requirements on the processes are greatly reduced, but also the processes are simple and process compatibility is good, which facilitates ensuring the etching uniformity, improving yield while reducing production cost.

In a display substrate provided by an exemplary embodiment of the present disclosure, the front contact connection mode is used for the polysilicon active layer and the side contact connection mode is used for the oxide active layer, not only implementation processes are simple, the requirement for synchronous etching process is reduced, which is also beneficial to ensuring etching uniformity and improving yield, but also the connection reliability of the side contact connection mode is improved, so that the overlapping resistance of the side contact and the overlapping resistance of the front contact have the same or similar resistance, thus the characteristics of low-temperature polysilicon thin film transistors and oxide thin film transistors are simultaneously improved.

The present disclosure further provides a method for manufacturing a display substrate. In an exemplary embodiment, the method may include:
  forming an active structure layer on a base substrate, wherein the active structure layer includes a first active layer and a second active layer, a material of the first active layer includes low-temperature polysilicon and a material of the second active layer includes oxide semiconductor;
  forming a source-drain structure layer on the active structure layer, wherein the source-drain structure layer includes a first source-drain electrode and a second source-drain electrode, the first source-drain electrode overlaps with a first side surface of the first active layer through a first via hole and the second source-drain electrode overlaps with a second side surface of the second active layer through a second via hole; wherein the first side surface is a surface parallel to the base substrate, and the second side surface is a surface intersecting with the base substrate.

In an example embodiment, forming the active layer on the base substrate may include:

sequentially forming the active structure layer including the first active layer and the second active layer on the base substrate;

forming a first via hole and a communication hole through a patterning process, wherein the first via hole exposes the first side surface of the first active layer and the communication hole exposes a first side surface of the second active layer;

etching the second active layer in the communication hole through a cleaning process to form a contact hole exposing the second side surface of the second active layer.

In an example embodiment, forming the active layer on the base substrate may include:

sequentially forming the active structure layer including the first active layer and the second active layer on the base substrate;

forming a communication hole through a patterning process, wherein the communication hole exposes the first side surface of the second active layer;

forming a first via hole through another patterning process, wherein the first via hole exposes the first side surface of the first active layer;

etching the second active layer in the communication hole through a cleaning process to form a contact hole exposing the second side surface of the second active layer.

In an exemplary embodiment, at an interface between the second active layer and the fifth insulating layer, an orthographic projection of the contact hole at the interface on the base substrate includes an orthographic projection of the communication hole at an interface on the base substrate.

In an exemplary embodiment, at the interface between the second active layer and the fifth insulating layer, a distance between boundaries of the contact hole at the interface is a first distance, and a distance between boundaries of the communication hole at the interface is a second distance, wherein the first distance is greater than the second distance.

In an exemplary embodiment, the first distance is 1.01 to 1.05 times the second distance.

In an exemplary embodiment, sequentially forming the active structure layer including the first active layer and the second active layer on the base substrate may include:

forming a first insulating layer on the base substrate, and the first active layer disposed on the first insulating layer, forming a second insulating layer covering the first active layer, and a first gate electrode and a first capacitor electrode which are disposed on the second insulating layer;

forming a third insulating layer covering the first gate electrode and the first capacitor electrode, and a second capacitor electrode and a light shield layer which are disposed on the third insulating layer;

forming a fourth insulating layer covering the second capacitor electrode and the shield layer, and a second active layer disposed on the fourth insulating layer;

forming a fifth insulating layer covering the second active layer, and a second gate electrode disposed on the fifth insulating layer; and, forming a sixth insulating layer covering the second gate electrode.

In an exemplary embodiment, forming the active structure layer on the base substrate may further include a step of performing anneal process of the first active layer and the second active layer.

In an exemplary embodiment, an etching process in the patterning process may include a dry etching process. Etching gas of the dry etching process includes fluorine-containing gas and auxiliary gas, wherein the fluorine-containing gas includes tetrafluoromethane or sulfur hexafluoride, and the auxiliary gas includes argon.

In an exemplary embodiment, a cleaning solution of the cleaning process includes a buffer oxide etch solution.

In an exemplary embodiment, the buffer oxide etch solution includes hydrogen fluoride and ammonium fluoride.

In the method for manufacturing a display substrate provided by the present disclosure, the connection between the second source-drain electrode and the second active layer is set in a side contact connection mode, which greatly reduces the difficulty of processes and the requirements on the processes. Moreover, the number of patterning processes is reduced, the processes are simplified, and the production cost is saved. The manufacturing process of the display substrate in the exemplary embodiment of the present disclosure has good process compatibility, simple process implementation, ease of implementation, high production efficiency, low production cost and high yield.

The present disclosure further provides a display apparatus including the display substrate in the aforementioned embodiments. The display apparatus may be any product or component with a display function such as a mobile phone, a tablet computer, a television, a display, a laptop computer, a digital photo frame, a navigator, etc.

Although the embodiments disclosed in the present disclosure are as described above, the described contents are only the embodiments for facilitating understanding of the present disclosure, which are not intended to limit the present disclosure. Any person skilled in the field to which the present disclosure pertains may make any modifications and variations in the forms and details of implementation without departing from the essence and the scope disclosed by the present disclosure. However, the patent protection scope of the present disclosure shall still be subject to the scope defined in the appended claims.

What is claimed is:

1. A display substrate, comprising a base substrate, an active structure layer disposed on the base substrate and a source-drain structure layer disposed on the active structure layer, wherein:

the active structure layer comprises a first active layer and a second active layer, a material of the first active layer comprises low-temperature polysilicon and a material of the second active layer comprises oxide semiconductors; the source-drain structure layer comprises a first source-drain electrode and a second source-drain electrode, wherein the first source-drain electrode overlaps with a first side surface of the first active layer through a first via hole and the second source-drain electrode overlaps with a second side surface of the second active layer through a second via hole; the first side surface is a surface parallel to the base substrate, and the second side surface is a surface intersecting with the base substrate;

the active structure layer comprises: a fifth insulating layer covering the second active layer, a second gate electrode disposed on the fifth insulating layer, and a sixth insulating layer covering the second gate electrode;

the second via hole comprises a communication hole provided on the fifth insulating layer and the sixth insulating layer and a contact hole provided on the second active layer, the communication hole communicates with the contact hole, and the second source-drain electrode overlaps with the second side surface of the second active layer through the contact hole;

at an interface between the second active layer and the fifth insulating layer, a distance between boundaries of the contact hole at the interface is a first distance, and a distance between boundaries of the communication hole at the interface is a second distance, and the first distance is greater than the second distance; and the first distance is 1.01 to 1.05 times the second distance.

2. The display substrate according to claim 1, wherein the active structure layer further comprises: a first insulating layer disposed on the base substrate, the first active layer disposed on the first insulating layer, a second insulating layer covering the first active layer, a first gate electrode provided on the second insulating layer, a third insulating layer covering the first gate electrode, a light shield layer disposed on the third insulating layer, a fourth insulating layer covering the light shield layer, the second active layer disposed on the fourth insulating layer; wherein the second insulating layer, the third insulating layer, the fourth insulating layer, the fifth insulating layer and the sixth insulating layer in the first via hole are removed to make the first source-drain electrode overlap with the first side surface of the first active layer through the first via hole; the second active layer, the fifth insulating layer and the sixth insulating layer in the second via hole are removed to make the second source-drain electrode overlap with the second side surface of the second active layer through the second via hole.

3. The display substrate according to claim 1, wherein at the interface between the second active layer and the fifth insulating layer, an orthographic projection of the contact hole at the interface on the base substrate comprises an orthographic projection of the communication hole at the interface on the base substrate.

4. The display substrate according to claim 1, wherein the second source-drain electrode overlaps with a first side surface of the fifth insulating layer.

5. A display apparatus, comprising the display substrate according to claim 1.

6. A method for manufacturing a display substrate, comprising:
forming an active structure layer on a base substrate, wherein the active structure layer comprises a first active layer and a second active layer, a material of the first active layer comprises low-temperature polysilicon and a material of the second active layer comprises oxide semiconductor; and
forming a source-drain structure layer on the active structure layer, wherein the source-drain structure layer comprises a first source-drain electrode and a second source-drain electrode, the first source-drain electrode overlaps with a first side surface of the first active layer through a first via hole and the second source-drain electrode overlaps with a second side surface of the second active layer through a second via hole; the first side surface is a surface parallel to the base substrate, and the second side surface is a surface intersecting with the substrate,
wherein the active structure layer comprises: a fifth insulating layer covering the second active layer, a second gate electrode disposed on the fifth insulating layer, and a sixth insulating layer covering the second gate electrode;

the second via hole comprises a communication hole provided on the fifth insulating layer and the sixth insulating layer and a contact hole provided on the second active layer, the communication hole communicates with the contact hole, and the second source-drain electrode overlaps with the second side surface of the second active layer through the contact hole;

at an interface between the second active layer and the fifth insulating layer, a distance between boundaries of the contact hole at the interface is a first distance, and a distance between boundaries of the communication hole at the interface is a second distance, and the first distance is greater than the second distance; and the first distance is 1.01 to 1.05 times the second distance.

7. The method according to claim 6, wherein forming the active structure layer on the base substrate comprises:
sequentially forming the active structure layer comprising the first active layer and the second active layer on the base substrate;
forming the first via hole and the communication hole through a patterning process, wherein the first via hole exposes the first side surface of the first active layer and the communication hole exposes a first side surface of the second active layer; and
etching the second active layer in the communication hole through a cleaning process to form the contact hole exposing the second side surface of the second active layer.

8. The method according to claim 6, wherein forming the active structure layer on the base substrate comprises:
sequentially forming the active structure layer comprising the first active layer and the second active layer on the base substrate;
forming the communication hole through a patterning process, wherein the communication hole exposes a first side surface of the second active layer;
forming the first via hole through another patterning process, wherein the first via hole exposes the first side surface of the first active layer; and
etching the second active layer in the communication hole through a cleaning process to form the contact hole exposing the second side surface of the second active layer.

9. The method according to claim 7, wherein at the interface between the second active layer and the fifth insulating layer, an orthographic projection of the contact hole at the interface on the base substrate comprises an orthographic projection of the communication hole at the interface on the base substrate.

10. The method according to claim 8, wherein at the interface between the second active layer and the fifth insulating layer, an orthographic projection of the contact hole at the interface on the base substrate comprises an orthographic projection of the communication hole at the interface on the base substrate.

* * * * *